(12) United States Patent
Song et al.

(10) Patent No.: US 11,871,603 B2
(45) Date of Patent: Jan. 9, 2024

(54) DISPLAY DEVICE AND CARRIER FILM

(71) Applicant: Samsung Display Co., Ltd., Yongin-Si (KR)

(72) Inventors: Kicheol Song, Suwon-si (KR); Youngmoon Kim, Asan-si (KR); Nari Ahn, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 205 days.

(21) Appl. No.: 17/012,608

(22) Filed: Sep. 4, 2020

(65) Prior Publication Data

US 2021/0193962 A1 Jun. 24, 2021

(30) Foreign Application Priority Data

Dec. 20, 2019 (KR) .................. 10-2019-0172174

(51) Int. Cl.
| | | |
|---|---|---|
| *H01L 51/52* | (2006.01) | |
| *H10K 50/844* | (2023.01) | |
| *B32B 7/12* | (2006.01) | |
| *B32B 27/08* | (2006.01) | |
| *B32B 27/28* | (2006.01) | |
| *B32B 27/36* | (2006.01) | |
| *B32B 27/34* | (2006.01) | |
| *B32B 7/022* | (2019.01) | |
| *B32B 7/02* | (2019.01) | |
| *H10K 77/10* | (2023.01) | |

(Continued)

(52) U.S. Cl.
CPC ............ *H10K 50/844* (2023.02); *B32B 7/02* (2013.01); *B32B 7/022* (2019.01); *B32B 7/12* (2013.01); *B32B 27/08* (2013.01); *B32B 27/281* (2013.01); *B32B 27/34* (2013.01); *B32B 27/36* (2013.01); *H10K 77/111* (2023.02); *B32B 2307/51* (2013.01); *B32B 2307/54* (2013.01); *B32B 2457/20* (2013.01); *H10K 59/12* (2023.02); *H10K 2102/311* (2023.02)

(58) Field of Classification Search
None
See application file for complete search history.

(56) References Cited

U.S. PATENT DOCUMENTS

| 9,893,314 | B2 | 2/2018 | Kwak et al. | |
|---|---|---|---|---|
| 2017/0307781 | A1* | 10/2017 | Lee ...................... | C08K 5/10 |

(Continued)

FOREIGN PATENT DOCUMENTS

| JP | 2019059927 A | 4/2019 |
|---|---|---|
| KR | 1020170020590 A | 2/2017 |

(Continued)

*Primary Examiner* — Anthony J Frost
(74) *Attorney, Agent, or Firm* — CANTOR COLBURN LLP

(57) ABSTRACT

A display device includes a display panel, a panel protective film disposed below the display panel, and a first adhesive layer disposed between the display panel and the panel protective film, where a test speed of a tensile test of the panel protective film is about 5 millimeters per minute (mm/min), Young's modulus of the panel protective film is measured in a range of strain in which strain of the panel protective film is about 0.05 percent (%) to about 0.5%, and the panel protective film has the Young's modulus of about 4324 megapascals (MPa) to about 4792 MPa at about 25 degrees Celsius.

11 Claims, 15 Drawing Sheets

(51) Int. Cl.
    *H10K 59/12*           (2023.01)
    *H10K 102/00*         (2023.01)

(56) References Cited

U.S. PATENT DOCUMENTS

| | | | |
|---|---|---|---|
| 2017/0373281 A1* | 12/2017 | Park | H01L 51/524 |
| 2018/0010024 A1* | 1/2018 | Lu | C08G 18/724 |
| 2018/0287092 A1* | 10/2018 | Song | H01L 51/0097 |
| 2018/0352664 A1 | 12/2018 | Park et al. | |
| 2019/0013487 A1 | 1/2019 | Park et al. | |
| 2019/0077999 A1* | 3/2019 | Ieda | B32B 27/304 |
| 2019/0386247 A1* | 12/2019 | Choi | B32B 27/36 |
| 2020/0058900 A1 | 2/2020 | Choi et al. | |

FOREIGN PATENT DOCUMENTS

| | | | | |
|---|---|---|---|---|
| KR | 101801689 B1 | 11/2017 | | |
| KR | 101801690 B1 | 11/2017 | | |
| KR | WO2018135866 | * 7/2018 | | H01L 51/52 |
| KR | 101884266 B1 | 8/2018 | | |
| KR | 1020180133287 A | 12/2018 | | |
| KR | 1020190005285 A | 1/2019 | | |
| KR | 1020200087917 A | 7/2020 | | |

\* cited by examiner ial No. 10-2019-0172174, filed on Dec. 20, 2019, and all the benefits accruing therefrom under 35 U.S.C. § 119, the content of which in its entirety is herein incorporated by reference.

BACKGROUND

1. Field

Exemplary embodiments of the invention herein relate to a display device and a carrier film.

2. Description of Related Art

An electronic device, which provides an image to a user, such as a smartphone, a digital camera, a laptop computer, a navigation device, and a smart television includes a display device to display an image. The display device generates the image and provides a user with the image through a display screen.

Recently, various types of the display device are being developed along with a technological development of the display device. A flexible display device that may be folded or rolled is under development. A flexible display device which has a variously changeable shape is easy to carry and may improve the convenience of a user.

The display device generally includes a display panel, a window disposed on the display panel, and a protective film disposed below the display panel. An adhesive layer may be disposed between the display panel and the protective film, and the protective film may be attached to the display panel by the adhesive layer.

SUMMARY

Exemplary embodiments of the invention provide a display device and a carrier film capable of reducing deformation in a folding area and damage to wires of a bonding part during a folding operation and a bonding process.

An exemplary embodiment of the invention provides a display device including a display panel, a panel protective film disposed below the display panel, and a first adhesive layer disposed between the display panel and the panel protective film, where a test speed of a tensile test of the panel protective film is about 5 millimeters per minute (mm/min), Young's modulus of the panel protective film is measured in a range of strain in which strain of the panel protective film is about 0.05 percent (%) to about 0.5%, and the panel protective film has the Young's modulus of about 4324 megapascals (MPa) to about 4792 MPa at about 25 degrees Celsius (° C.) and has the Young's modulus of about 3646 megapascals to about 3924 megapascals at about 85 degrees Celsius.

An exemplary embodiment of the invention provides a carrier film including a first protective film, a second protective film disposed on the first protective film, a panel protective film disposed between the first protective film and the second protective film, a dummy adhesive layer disposed between the first protective film and the panel protective film, and a first adhesive layer disposed between the panel protective film and the second protective film, where a test speed of a tensile test of the panel protective film is about 5 mm/min, Young's modulus of the panel protective film is measured in a range of strain in which strain of the panel protective film is about 0.05% to about 0.5%, and the panel protective film has the Young's modulus of about 4324 MPa to about 4792 MPa at about 25° C. and has the Young's modulus of about 3646 MPa to about 3924 MPa at about 85° C.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to describe principles of the invention. In the drawings.

DETAILED DESCRIPTION

Figure 1:
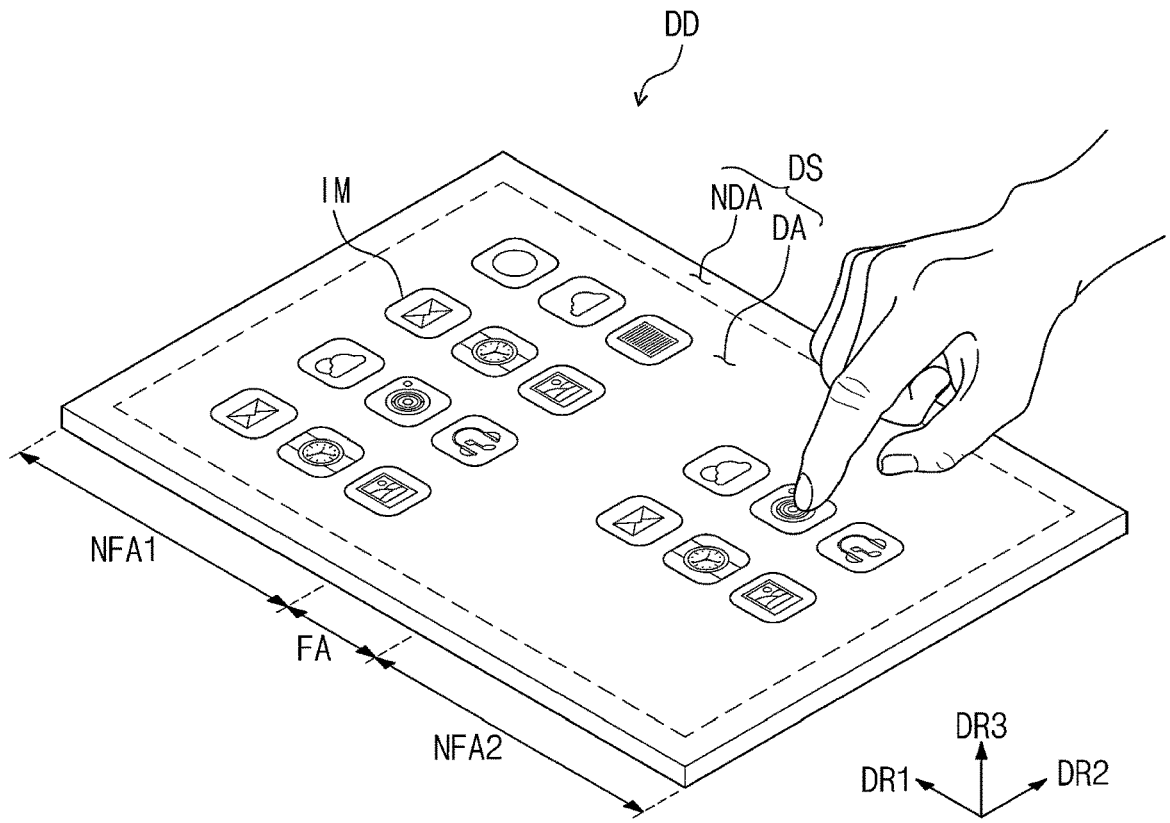
FIG. 1 illustrates an exemplary embodiment of a display device according to the invention.

It will be understood that when an element or layer is referred to as being "on", "connected to" or "coupled to" another element or layer, it can be directly on, connected or coupled to the other element or layer, or intervening elements or layers may be present.

Like reference numerals refer to like elements throughout this specification. In the drawing figures, the thicknesses, ratios and dimensions of elements are exaggerated for effective description of the technical contents.

As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention. As used herein, the singular forms, "a", "an" and "the" are intended to include the plural forms as well, unless the context clearly indicates otherwise.

Spatially relative terms, such as "beneath", "below", "lower", "above", and "upper", may be used herein for ease of description to describe one element or feature's relationship to another element(s) or feature(s) as illustrated in the drawing figures. It will be understood that the spatially relative terms are intended to encompass different orientations of the device in use or operation in addition to the orientation depicted in the drawing figures.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "include" or "have", when used in this specification, specify the presence of stated features, integers, steps, operations, elements, and/or components, but do not preclude the presence or addition of one or more other features, integers, steps, operations, elements, components, and/or groups thereof.

Hereinafter, the invention will be explained in detail with reference to the accompanying drawings.

Figure 2:
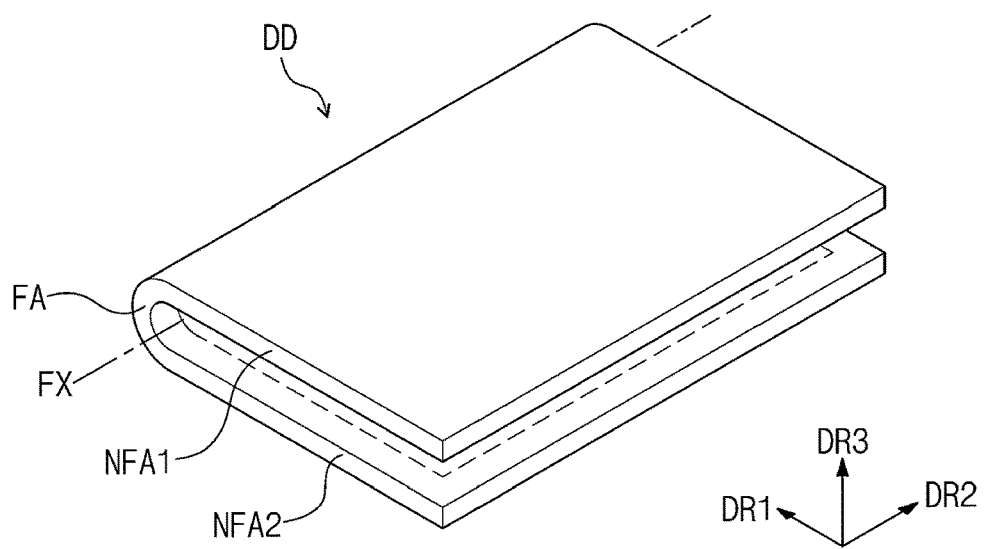
FIG. 2 illustrates a folded state of the display device illustrated in FIG. 1.

FIG. 1 illustrates an exemplary embodiment of a display device according to the invention. FIG. 2 illustrates a folded state of the display device illustrated in FIG. 1.

Referring to FIG. 1, a display device DD in an exemplary embodiment of the invention may have a quadrangular shape (e.g., rectangular shape) including long sides in a first direction DR1, and short sides in a second direction DR2 crossing the first direction DR1. However, the display device DD is not limited thereto, and may have various shapes such as a circle and a polygon. The display device DD may be a flexible display device.

Hereinafter, a direction substantially perpendicular to a plane defined by the first direction DR1 and the second direction DR2 is defined as a third direction DR3.

The display device DD may include a folding area FA and a plurality of non-folding areas NFA1 and NFA2. The non-folding areas NFA1 and NFA2 may include a first non-folding area NFA1 and a second non-folding area NFA2. The folding area FA may be disposed between the first non-folding area NFA1 and the second non-folding area NFA2. The folding area FA, the first non-folding area NFA1, and the second non-folding area NFA2 may be arranged in the first direction DR1.

Although one folding area FA and two non-folding areas NFA1 and NFA2 are illustrated by way of example, the number of the folding area FA and the non-folding areas NFA1 and NFA2 is not limited thereto. In an exemplary embodiment, the display device DD may include more than two non-folding areas, and a plurality of folding areas disposed between the more than two non-folding areas, for example.

A top surface of the display device DD may be defined as a display surface DS and may have a plane defined by the first direction DR1 and the second direction DR2. Images IM generated in the display device DD may be provided to a user through the display surface DS.

The display surface DS may include a display area DA and a non-display area NDA around the display area DA. The display area DA may display an image, and the non-display area NDA may not display an image. The non-display area NDA surrounds the display area DA and may define an edge of the display device DD printed in a predetermined color.

Referring to FIG. 2, the display device DD may be a foldable display device DD that is folded or unfolded. In an exemplary embodiment, the folding area FA may be bent around a folding axis FX parallel to the second direction DR2, and thus the display device DD may be folded, for example. The folding axis FX may be defined as a short axis parallel to the short sides of the display device DD.

When the display device DD is folded, the first non-folding area NFA1 and the second non-folding area NFA2 may face each other, and the display device DD may be in-folded so that the display surface DS is not exposed to the outside.

Figure 3:
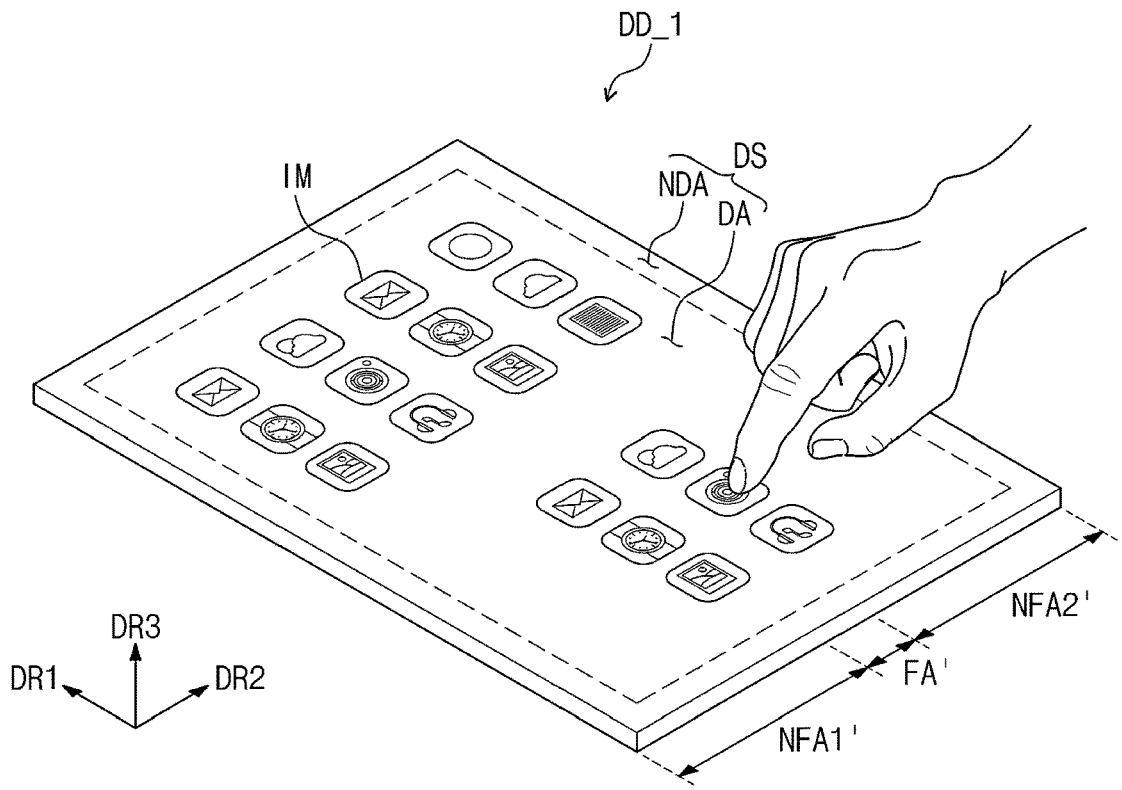
FIG. 3 illustrates an exemplary embodiment of a display device according to the invention.
Figure 4:
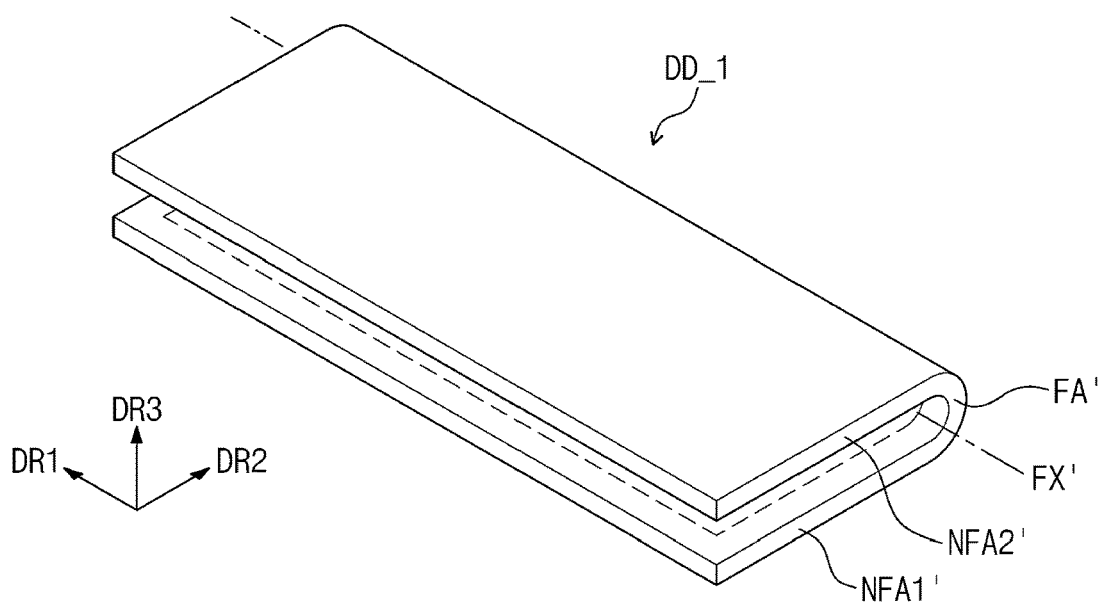
FIG. 4 illustrates a folded state of the display device illustrated in FIG. 3.

FIG. 3 illustrates an exemplary embodiment of a display device according to the invention. FIG. 4 illustrates a folded state of the display device illustrated in FIG. 3.

Except for a folding operation, a display device DD_1 illustrated in FIG. 3 may have substantially the same configuration as the display device DD illustrated in FIG. 1. Accordingly, the folding operation of the display device DD_1 will be mainly described below.

Referring to FIGS. 3 and 4, the display device DD_1 may include a folding area FA' and a plurality of non-folding areas NFA1' and NFA2'. The non-folding areas NFA1' and NFA2' may include a first non-folding area NFA1' and a second non-folding area NFA2'. The folding area FA' may be disposed between the first non-folding area NFA1' and the second non-folding area NFA2'. The folding area FA', the first non-folding area NFA1', and the second non-folding area NFA2' may be arranged in the second direction DR2.

The folding area FA' may be bent around a folding axis FX' parallel to the first direction DR1, and thus the display device DD_1 may be folded. The folding axis FX' may be defined as a long axis parallel to long sides of the display device DD_1. The display device DD illustrated in FIG. 1 may be folded around the short axis, whereas the display device DD_1 illustrated in FIG. 3 may be folded around the long axis. The display device DD_1 may be in-folded so that the display surface DS is not exposed to the outside.

Although the display devices DD and DD_1 are exemplarily described which are in-folded around the folding axes FX and FX' respectively, the folding operations of the display devices DD and DD_1 are not limited thereto. In an exemplary embodiment, the display devices DD and DD_1 may also be out-folded so that the display surface DS is exposed to the outside, for example.

Hereinafter, the display device DD which is in-folded around the folding axis FX will be described by way of example.

Figure 5:
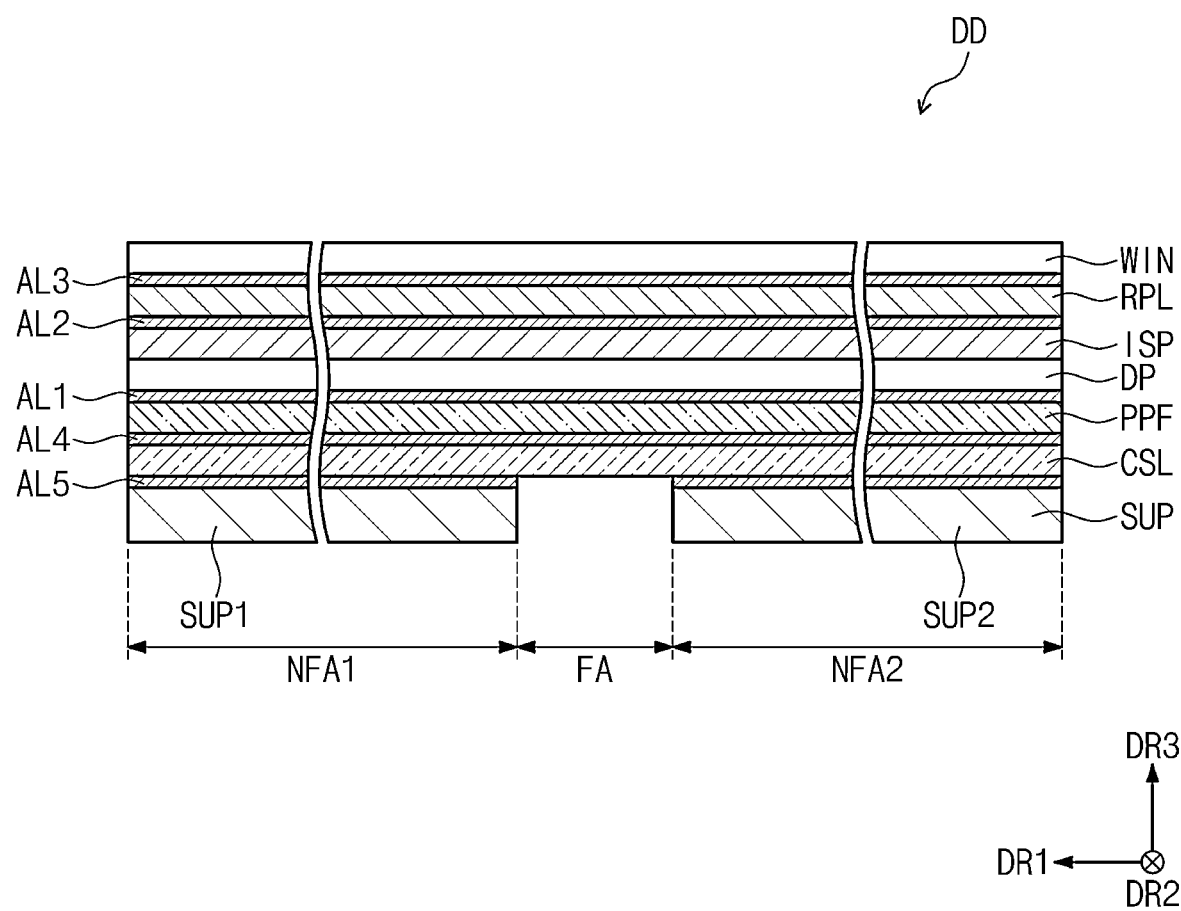
FIG. 5 exemplarily illustrates a cross section of the display device illustrated in FIG. 1.

FIG. 5 exemplarily illustrates a cross section of the display device illustrated in FIG. 1.

Referring to FIG. 5, the display device DD may include a display panel DP, an input sensing unit ISP, an anti-reflection layer RPL, a window WIN, a panel protective film PPF, a cushion layer CSL, a support part SUP, and first to fifth adhesive layers AL1 to AL5. The input sensing unit ISP, the anti-reflection layer RPL, and the window WIN may be disposed on the display panel DP. The panel protective film PPF, the cushion layer CSL, and the support part SUP may be disposed below the display panel DP.

The display panel DP may be a flexible display panel. In an exemplary embodiment, the display panel DP may include a plurality of electronic elements disposed on a flexible substrate, for example. The display panel DP may include the first non-folding area NFA1, the second non-folding area NFA2, and the folding area FA disposed between the first non-folding area NFA1 and the second non-folding area NFA2.

The display panel DP in an exemplary embodiment of the invention may be a light emitting display panel, but is not particularly limited. In an exemplary embodiment, the display panel DP may be an organic light emitting display panel or a quantum dot light emitting display panel, for example. A light emitting layer of an organic light emitting display panel may include an organic light emitting material. A light emitting layer of a quantum dot light emitting display panel may include a quantum dot, a quantum rod, or the like. Hereinafter, the display panel DP will be described as an organic light emitting display panel.

The input sensing unit ISP may be disposed on the display panel DP. The input sensing unit ISP may include a plurality of sensors (not illustrated) to sense an external input. The sensors may sense the external input in a capacitive method. The input sensing unit ISP may be manufactured directly on the display panel DP when the display panel DP is manufactured. However, the input sensing unit ISP is not limited thereto, and may be manufactured as a panel separate from the display panel DP to be attached to the display panel DP by an adhesive layer.

The anti-reflection layer RPL may be disposed on the input sensing unit ISP. The anti-reflection layer RPL may be defined as a film that prevents reflection of external light. The anti-reflection layer RPL may reduce the reflectance of external light incident on the display panel DP from above the display device DD. The anti-reflection layer RPL may include a phase retarder and/or a polarizer by way of example.

The window WIN may be disposed on the anti-reflection layer RPL. The window WIN may protect the display panel DP, the input sensing unit ISP, and the anti-reflection layer RPL from external scratches and impacts. The window WIN may have an optically transparent property.

The panel protective film PPF may be disposed below the display panel DP. The panel protective film PPF may be defined as a protective substrate. The panel protective film PPF may protect a lower portion of the display panel DP. The panel protective film PPF may include a plastic material.

In an exemplary embodiment, the panel protective film PPF may include polyimide ("PI"), polyamide ("PA"), aramid, polyethylene naphthalene ("PEN"), or polyethylene terephthalate ("PET"), for example.

The cushion layer CSL may be disposed below the panel protective film PPF. The cushion layer CSL may protect the display panel DP by absorbing an external impact applied to a lower portion of the display device DD. The cushion layer CSL may include a foam sheet having a predetermined elastic force.

The support part SUP may be disposed below the cushion layer CSL. The support part SUP may support the display panel DP. The support part SUP may include a first support portion SUP1 overlapping the first non-folding area NFA1 and a second support portion SUP2 overlapping the second non-folding area NFA2. The first support portion SUP1 may support the display panel DP in the first non-folding area NFA1, and the second support portion SUP2 may support the display panel DP in the second non-folding area NFA2.

The first support portion SUP1 and the second support portion SUP2 may include a metal. In an exemplary embodiment, the first support portion SUP1 and the second support portion SUP2 may include stainless steel, aluminum, or an alloy thereof, for example. The strength of the first support portion SUP1 and the second support portion SUP2 may be greater than that of the display panel DP.

The first adhesive layer AL1 may be disposed between the display panel DP and the panel protective film PPF. The display panel DP and the panel protective film PPF may be bonded to each other by the first adhesive layer AL1.

The second adhesive layer AL2 may be disposed between the anti-reflection layer RPL and the input sensing unit ISP. The anti-reflection layer RPL and the input sensing unit ISP may be bonded to each other by the second adhesive layer AL2.

The third adhesive layer AL3 may be disposed between the window WIN and the anti-reflection layer RPL. The window WIN and the anti-reflection layer RPL may be bonded to each other by the third adhesive layer AL3.

The fourth adhesive layer AL4 may be disposed between the panel protective film PPF and the cushion layer CSL. The panel protective film PPF and the cushion layer CSL may be bonded to each other by the fourth adhesive layer AL4.

The fifth adhesive layer AL5 may be disposed between the cushion layer CSL and the support part SUP. The cushion layer CSL and the support part SUP may be bonded to each other by the fifth adhesive layer AL5.

Figure 6:
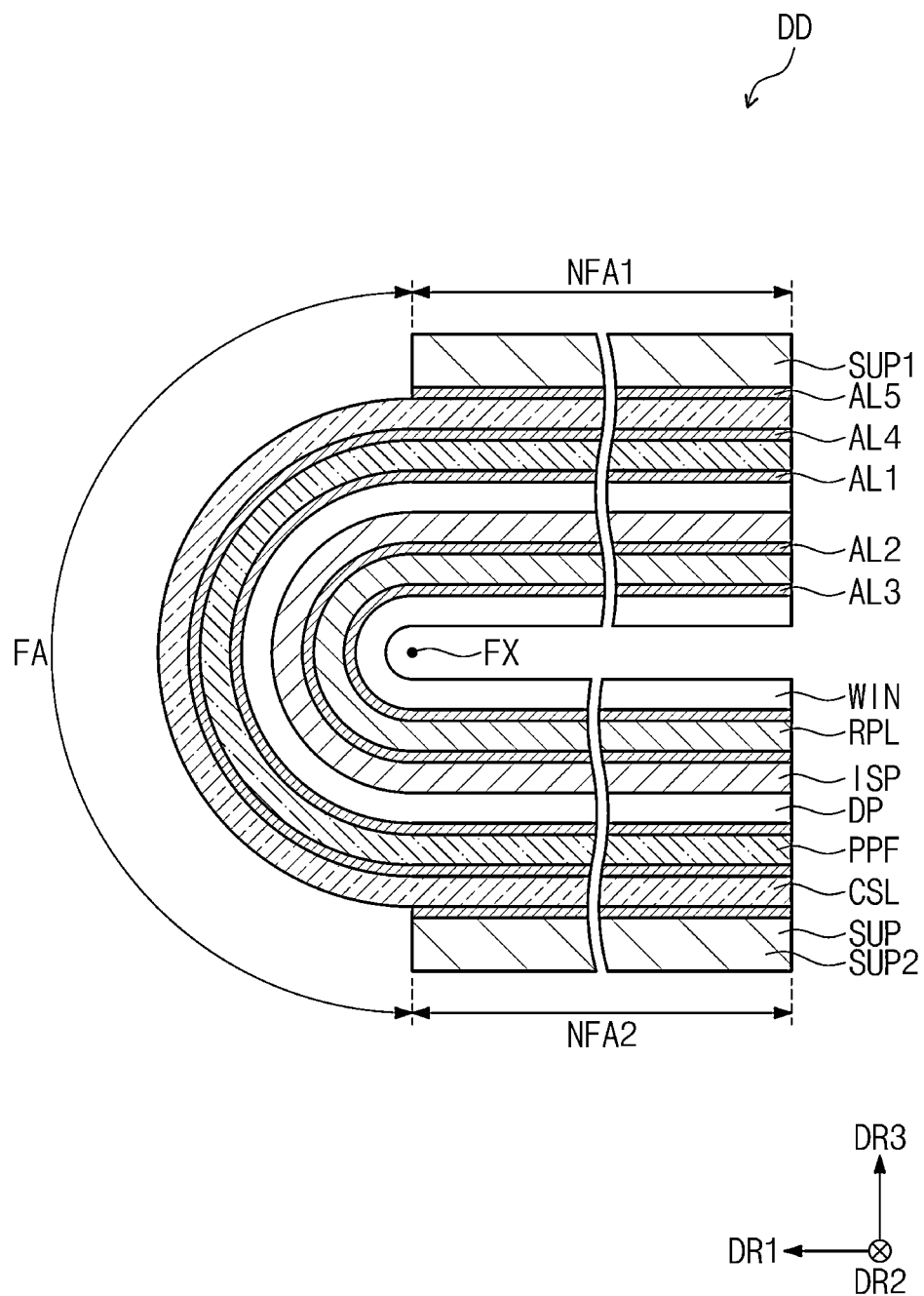
FIG. 6 illustrates an in-folded state of the display device illustrated in FIG. 5.

FIG. 6 illustrates an in-folded state of the display device illustrated in FIG. 5.

Referring to FIG. 6, the display device DD may be in-folded around the folding axis FX. The display device DD may change from a first state, in which the display device DD is flat, illustrated in FIG. 5 to a second state, in which the display device DD is folded, illustrated in FIG. 6, or may change from the second state to the first state. This folding operation may be performed repeatedly.

An area of the display device DD overlapping the first support portion SUP1 and an area of the display device DD overlapping the second support portion SUP2 may be kept flat. The folding area FA may be bent in an area from the boundary between the first support portion SUP1 and the folding area FA to the boundary between the second support portion SUP2 and the folding area FA.

However, this is illustrated by way of example, and an area that is bent is not limited thereto. In an exemplary embodiment, the display device DD may be kept flat up to a portion of the folding area FA adjacent to the first support portion SUP1 and up to another portion of the folding area FA adjacent to the second support portion SUP2, and the remaining portion of the folding area FA may be bent to fold the display device DD, for example. The folding operation may be performed mainly at room temperature. In an exemplary embodiment, room temperature may be 25° C., for example.

For the folding operation of the display device DD, the window WIN, the anti-reflection layer RPL, the input sensing unit ISP, the display panel DP, the panel protective film PPF, the cushion layer CSL, and the first to fifth adhesive layers AL1 to AL5 may have flexible properties.

When the folding operation is repeatedly performed, stress generated in the folding area FA may affect the panel protective film PPF. In an exemplary embodiment of the invention, however, the panel protective film PPF may have high elastic properties at room temperature. Deformation in the folding area FA may be reduced by the panel protective film PPF having high elastic properties. The physical properties of the panel protective film PPF having high elastic properties will be described in detail with reference to the following tables.

Figure 7:
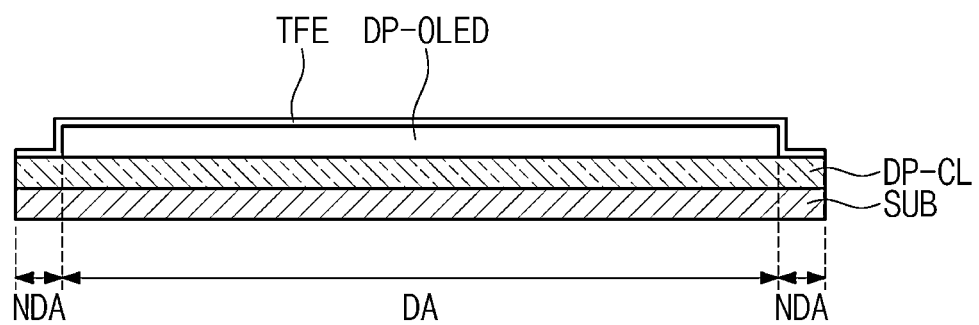
FIG. 7 exemplarily illustrates a cross section of the display panel illustrated in FIG. 5.
Figure 7:
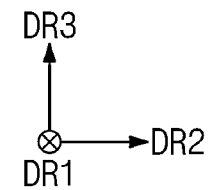

FIG. 7 exemplarily illustrates a cross section of the display panel illustrated in FIG. 5.

Referring to FIG. 7, the display panel DP may include a substrate SUB, a circuit element layer DP-CL disposed on the substrate SUB, a display element layer DP-OLED disposed on the circuit element layer DP-CL, and a thin film encapsulation layer TFE disposed on the display element layer DP-OLED.

The substrate SUB may include the display area DA and the non-display area NDA around the display area DA. The substrate SUB may include a flexible plastic material. In an exemplary embodiment, the substrate SUB may include PI, for example.

The display element layer DP-OLED may be disposed in the display area DA. The thin film encapsulation layer TFE may be disposed on the circuit element layer DP-CL so as to cover the display element layer DP-OLED.

A plurality of pixels may be arranged in the circuit element layer DP-CL and the display element layer DP-OLED. Each of the pixels may include a transistor disposed in the circuit element layer DP-CL and a light emitting element disposed in the display element layer DP-OLED and connected to the transistor. The configuration of the pixel will be described in detail below.

The thin film encapsulation layer TFE may include at least two inorganic layers and an organic layer disposed between the inorganic layers. The inorganic layers may include an inorganic material and may protect the pixels from moisture/oxygen. The organic layer may include an organic material and may protect the pixels from foreign matter such as dust particles. The input sensing unit ISP described above may be disposed on the thin film encapsulation layer TFE.

Figure 8:
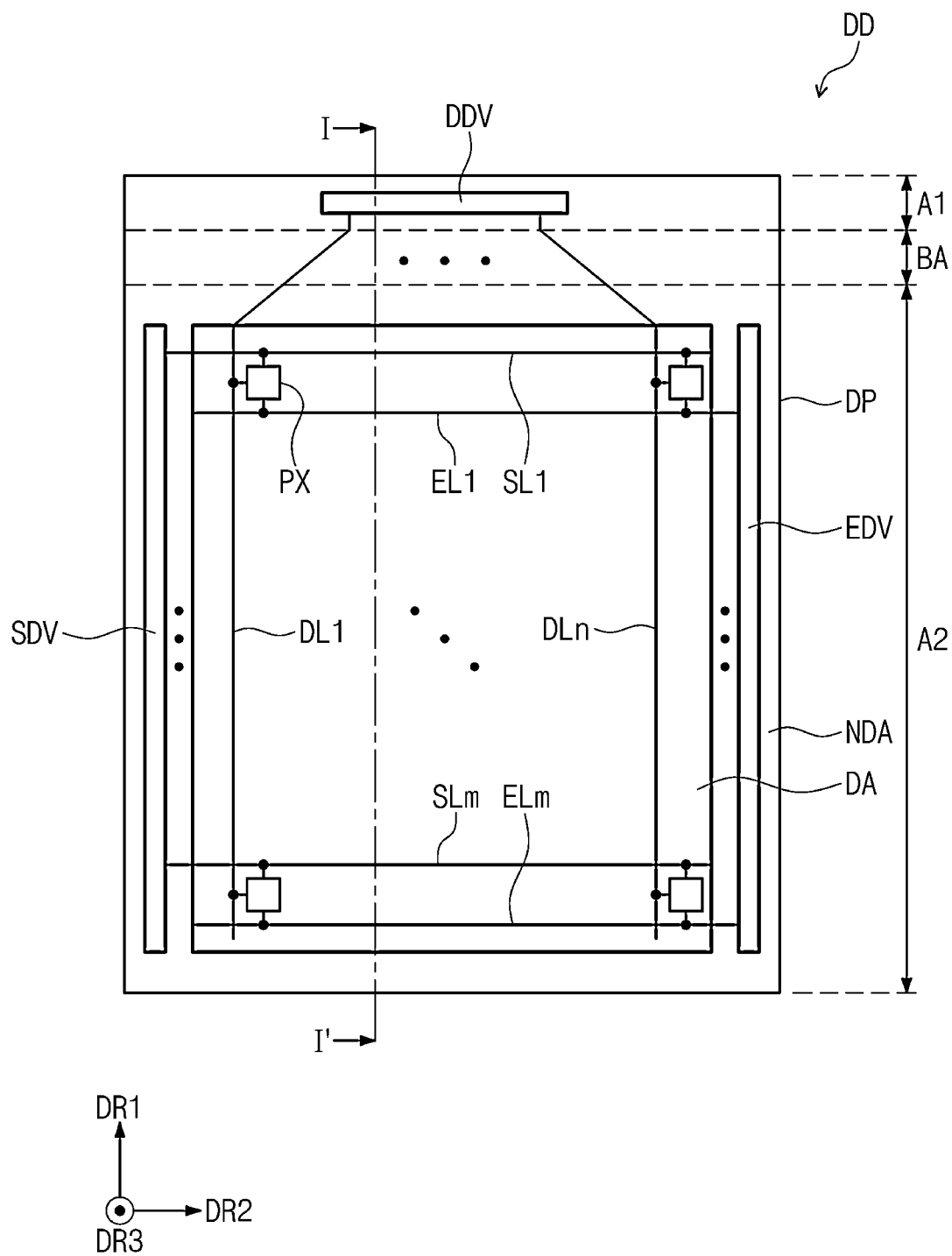
FIG. 8 is a plan view of the display panel illustrated in FIG. 5.

FIG. 8 is a plan view of the display panel illustrated in FIG. 5.

Referring to FIG. 8, the display device DD in an exemplary embodiment of the invention may include the display panel DP, a scan driver SDV, a data driver DDV, and an emission driver EDV. The display panel DP may have a rectangular shape including long sides in the first direction DR1 and short sides in the second direction DR2.

The display panel DP may include a first area A1, a second area A2, and a bending area BA disposed between the first area A1 and the second area A2. The bending area BA may extend in the second direction DR2, and the first area A1, the bending area BA, and the second area A2 may be arranged in the first direction DR1.

The second area A2 may include the display area DA and the non-display area NDA around the display area DA. The non-display area NDA may surround the display area DA. The display area DA may be an area in which an image is displayed, and the non-display area NDA may be an area in which an image is not displayed. The first area A1 and the bending area BA may be areas in which an image is not displayed.

The display panel DP may include a plurality of pixels PX, a plurality of scan lines SL1 to SLm, a plurality of data lines DL1 to DLn, and a plurality of emission lines EL1 to ELm. Here, m and n are natural numbers. The pixels PX may be arranged in the display area DA, and may be connected to the scan lines SL1 to SLm, the data lines DL1 to DLn, and the emission lines EL1 to ELm.

The scan driver SDV and the emission driver EDV may be disposed in the non-display area NDA of the second area A2, and the data driver DDV may be disposed in the first area A1. The scan driver SDV and the emission driver EDV may be disposed in portions of the non-display area NDA respectively adjacent to the long sides of the display panel DP in the second area A2. The data driver DDV may be manufactured in the form of an integrated circuit ("IC") chip and disposed in the first area A1.

The scan lines SL1 to SLm may extend in the second direction DR2 to be connected to the scan driver SDV. The data lines DL1 to DLn may extend in the first direction DR1, and may be connected to the data driver DDV via the bending area BA. The emission lines EL1 to ELm may extend in the second direction DR2 to be connected to the emission driver EDV.

The scan driver SDV may generate a plurality of scan signals, and the scan signals may be applied to the pixels PX through the scan lines SL1 to SLm. The scan signals may be sequentially applied to the pixels PX. The data driver DDV may generate a plurality of data voltages, and the data voltages may be applied to the pixels PX through the data lines DL1 to DLn. The emission driver EDV may generate a plurality of light emission signals, and the light emission signals may be applied to the pixels PX through the emission lines EL1 to ELm.

Although not illustrated, the display device DD may include a timing controller to control operations of the scan driver SDV, the data driver DDV, and the emission driver EDV.

The pixels PX may receive the data voltages in response to the scan signals. The pixels PX may display an image by emitting light of luminance corresponding to the data voltages in response to the light emission signals. The light emission time of the pixels PX may be controlled by the light emission signals.

Figure 9:
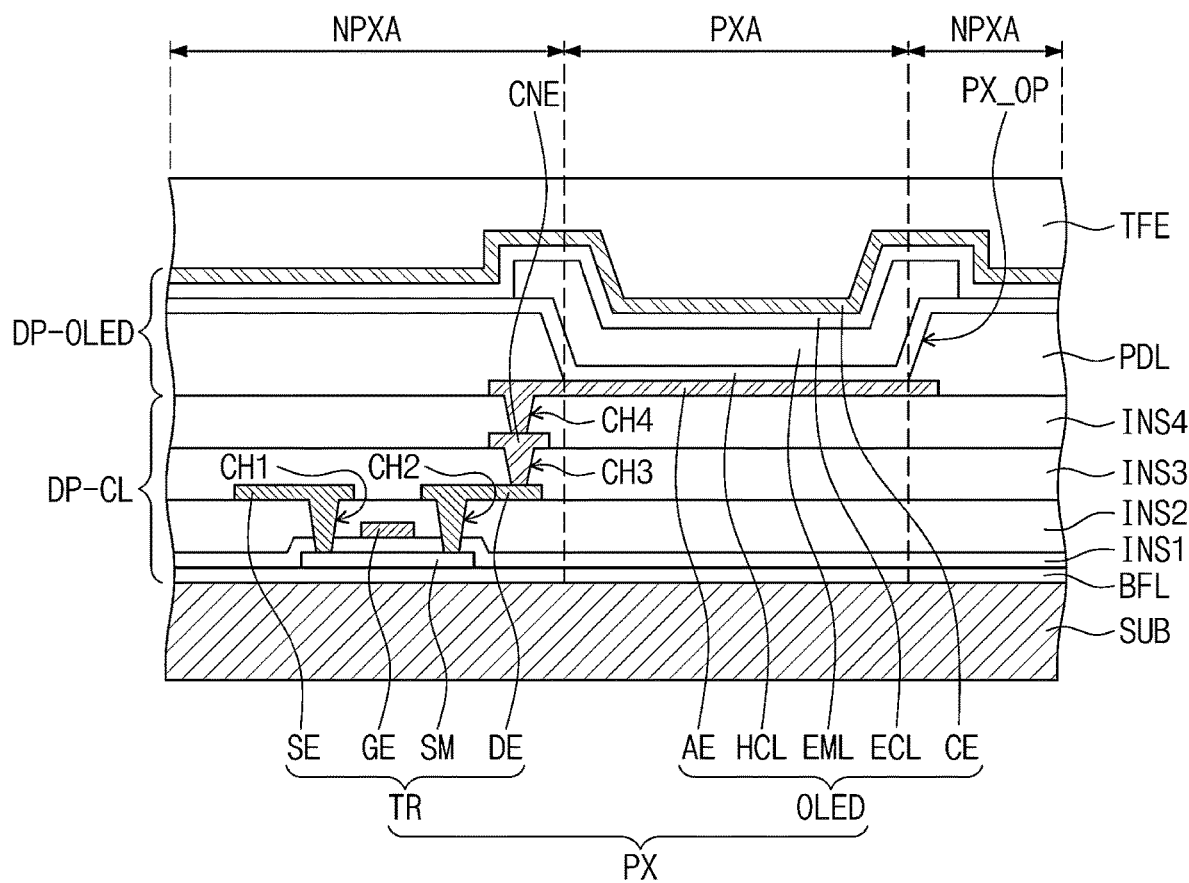
FIG. 9 schematically illustrates a cross-sectional structure of any one of the pixels illustrated in FIG. 8.

FIG. 9 schematically illustrates a cross-sectional structure of any one of the pixels illustrated in FIG. 8.

Referring to FIG. 9, each of the pixels PX may include a light emitting element OLED and a transistor TR connected to the light emitting element OLED. The light emitting element OLED may include a first electrode AE, a second electrode CE, a hole control layer HCL, an electron control layer ECL, and a light emitting layer EML. In an exemplary embodiment, the first electrode AE may be an anode, and the second electrode CE may be a cathode, for example, but are not limited thereto. The light emitting element OLED may be defined as an organic light emitting element.

The transistor TR and the light emitting element OLED may be disposed on the substrate SUB. The substrate SUB may include a light emitting area PXA corresponding to each of the pixels PX and a non-light emitting area NPXA around the light emitting area PXA. The light emitting element OLED may be disposed in the light emitting area PXA, and the transistor TR may be disposed in the non-light emitting area NPXA.

A buffer layer BFL may be disposed on the substrate SUB and may include an inorganic material. A semiconductor layer SM of the transistor TR may be disposed on the buffer layer BFL. The semiconductor layer SM may include a semiconductor of an inorganic material such as amorphous silicon and polysilicon, or an organic semiconductor. In addition, the semiconductor layer SM may include an oxide semiconductor. Although not illustrated in FIG. 9, a source area, a drain area, and a channel area between the source area and the drain area may be included in the semiconductor layer SM.

A first insulating layer INS1 may be disposed on the buffer layer BFL so as to cover the semiconductor layer SM. The first insulating layer INS1 may include an inorganic material. A gate electrode GE of the transistor TR overlapping the semiconductor layer SM may be disposed on the first insulating layer INS1. The gate electrode GE may overlap the channel area of the semiconductor layer SM.

A second insulating layer INS2 may be disposed on the first insulating layer INS1 so as to cover the gate electrode GE. The second insulating layer INS2 may include an organic material and/or an inorganic material.

A source electrode SE and a drain electrode DE of the transistor TR may be spaced apart from each other on the second insulating layer INS2. The source electrode SE may be connected to the source area of the semiconductor layer SM through a first contact hole CH1 defined in the first insulating layer INS1 and the second insulating layer INS2. The drain electrode DE may be connected to the drain area of the semiconductor layer SM through a second contact hole CH2 defined in the first insulating layer INS1 and the second insulating layer INS2.

A third insulating layer INS3 may be disposed on the second insulating layer INS2 so as to cover the source electrode SE and the drain electrode DE of the transistor TR. The third insulating layer INS3 may include an organic material. A connection electrode CNE may be disposed on the third insulating layer INS3. The connection electrode CNE may be connected to the drain electrode DE through a third contact hole CH3 defined in the third insulating layer INS3.

A fourth insulating layer INS4 may be disposed on the third insulating layer INS3 so as to cover the connection electrode CNE. The first electrode AE may be disposed on the fourth insulating layer INS4. The first electrode AE may be connected to the connection electrode CNE through a fourth contact hole CH4 defined in the fourth insulating layer INS4.

A pixel defining film PDL exposing a predetermined portion of the first electrode AE may be disposed on the first electrode AE and the fourth insulating layer INS4. An opening PX_OP to expose the predetermined portion of the first electrode AE may be defined in the pixel defining film PDL.

The hole control layer HCL may be disposed on the first electrode AE and the pixel defining film PDL. The hole control layer HCL may be disposed in common in the light emitting area PXA and the non-light emitting area NPXA. The hole control layer HCL may include a hole transport layer, and may further include a hole injection layer.

The light emitting layer EML may be disposed on the hole control layer HCL. The light emitting layer EML may be disposed in an area corresponding to the opening PX_OP. That is, the light emitting layer EML may be separately formed in each of the pixels PX. The light emitting layer EML may include an organic material and/or an inorganic material. In an exemplary embodiment, the light emitting layer EML may generate light of any one of red, green, and blue, for example. However, the light emitting layer EML is not limited thereto and may also generate white light by a combination of organic materials that generate red, green, and blue light.

The electron control layer ECL may be disposed on the light emitting layer EML. The electron control layer ECL may be disposed on the hole control layer HCL so as to cover the light emitting layer EML. That is, the electron control layer ECL may be disposed in common in the light emitting area PXA and the non-light emitting area NPXA. The electron control layer ECL may include an electron transport layer, and may further include an electron injection layer.

The second electrode CE may be disposed on the electron control layer ECL. The second electrode CE may be disposed in the pixels PX in common. The thin film encapsulation layer TFE may be disposed on the second electrode CE.

The layers from the buffer layer BFL to the fourth insulating layer INS4 may be defined as the circuit element layer DP-CL. The layers from the first electrode AE to the second electrode CE may be defined as the display element layer DP-OLED.

A first voltage may be applied to the first electrode AE, and a second voltage lower than the first voltage may be applied to the second electrode CE. A hole and an electron injected into the light emitting layer EML may combine to generate an exciton, and the light emitting element OLED may emit light as the exciton transitions to a ground state. An image may be displayed as the light emitting element OLED emits light.

Figure 10:
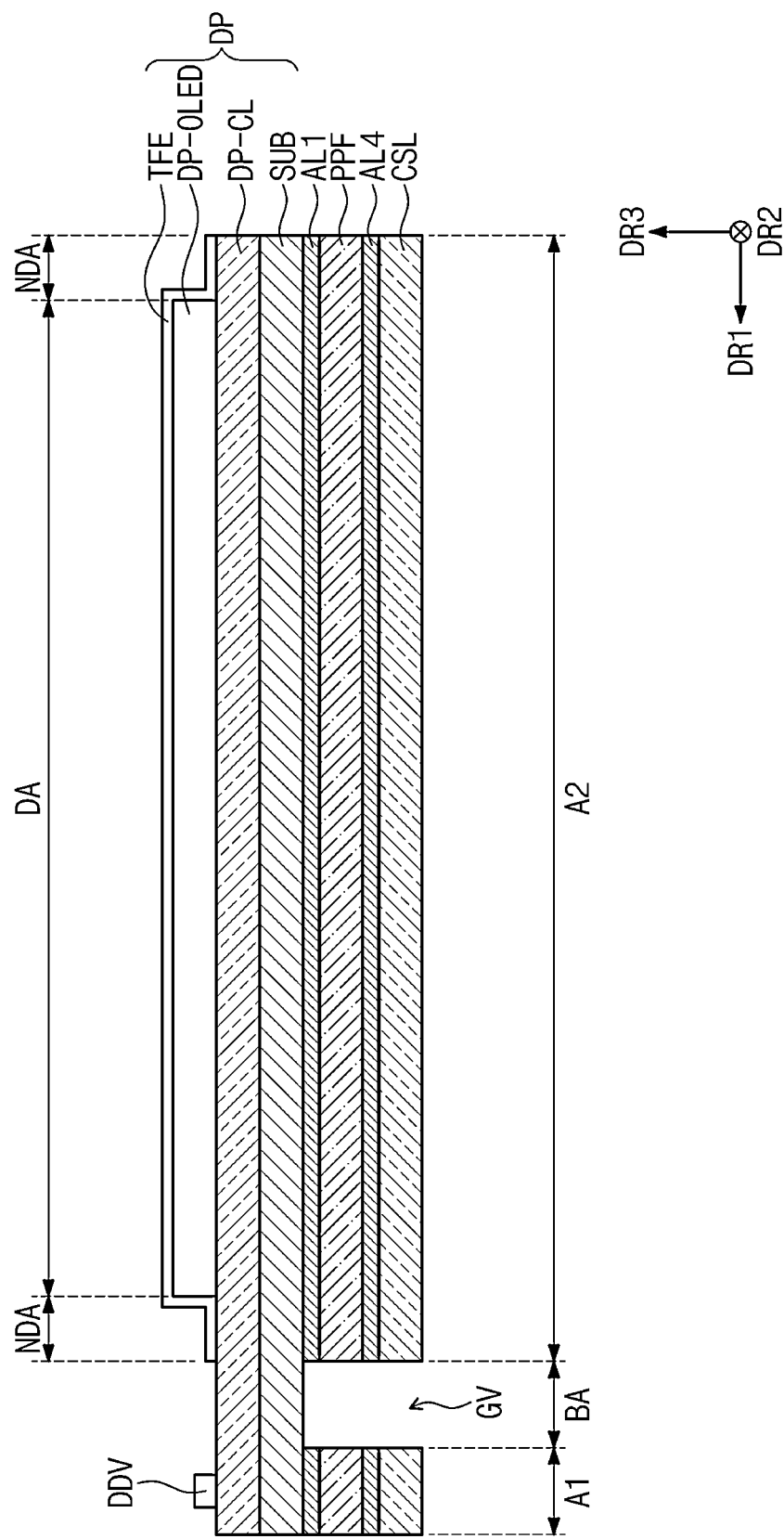
FIG. 10 is a cross-sectional view taken along line I-I' illustrated in FIG. 8.
Figure 11:
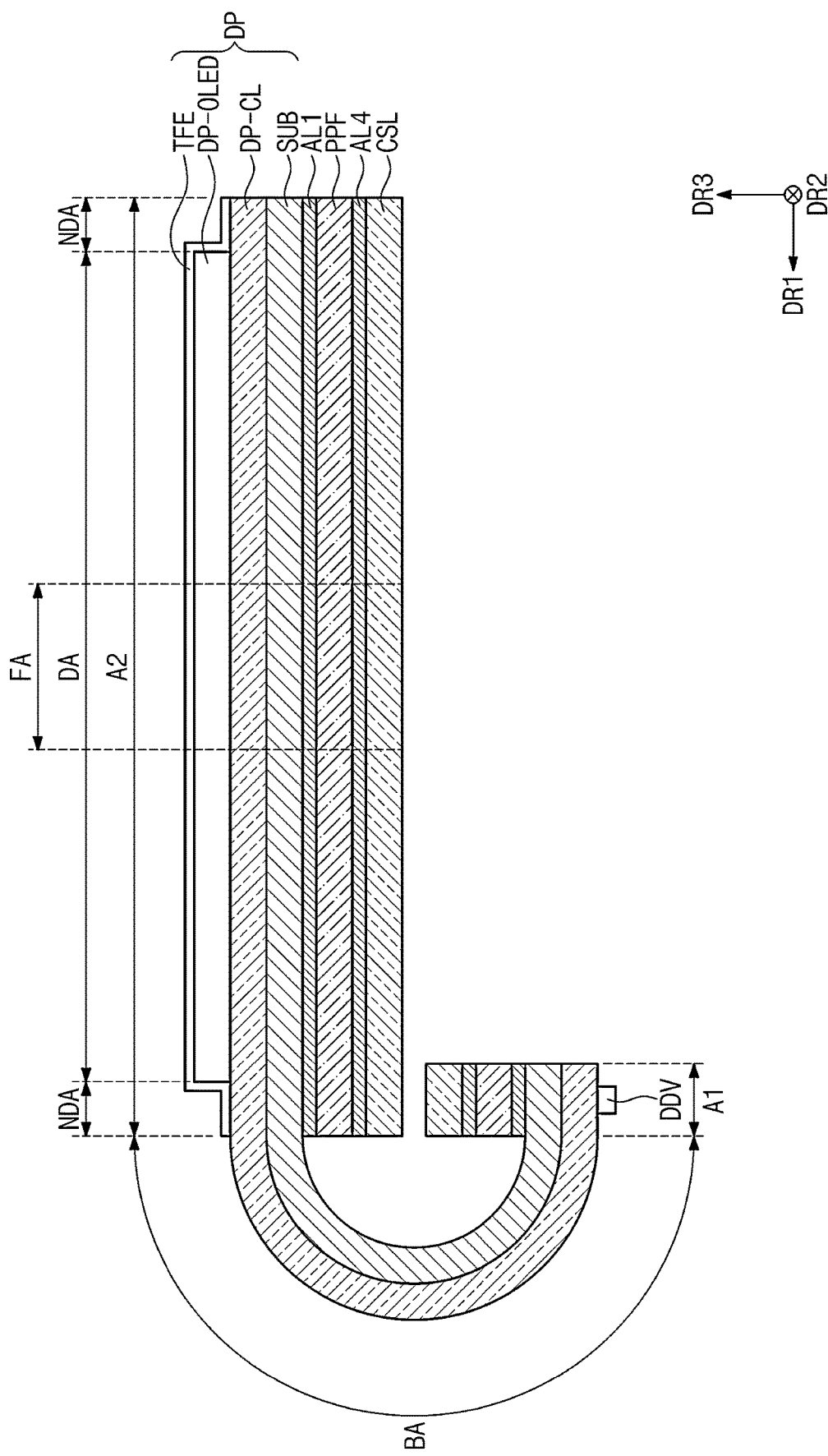
FIG. 11 illustrates a bent state of the bending area illustrated in FIG. 10.

FIG. 10 is a cross-sectional view taken along line I-I' illustrated in FIG. 8. FIG. 11 illustrates a bent state of the bending area illustrated in FIG. 10.

For convenience of description, the input sensing unit ISP, the anti-reflection layer RPL, the window WIN, and the support part SUP are omitted in FIGS. 10 and 11.

Referring to FIG. 10, the display element layer DP-OLED may be disposed in the display area DA of the second area A2, and the thin film encapsulation layer TFE may be disposed in the second area A2. Although not illustrated, a protective layer may further be disposed between the thin film encapsulation layer TFE and the data driver DDV to protect wires of the circuit element layer DP-CL. The data driver DDV may be disposed on the circuit element layer DP-CL in the first area A1.

The panel protective film PPF and the first adhesive layer AL1 may be disposed below the display panel DP in the first area A1 and the second area A2. The panel protective film PPF and the first adhesive layer AL1 may not be disposed below the display panel DP in the bending area BA.

The cushion layer CSL and the fourth adhesive layer AL4 may be disposed below the display panel DP in the first area A1 and the second area A2. The cushion layer CSL and the fourth adhesive layer AL4 may not be disposed below the display panel DP in the bending area BA.

Because the panel protective film PPF, the first adhesive layer AL1, the cushion layer CSL, and the fourth adhesive layer AL4 are not disposed in the bending area BA, a groove GV may be defined below the display panel DP in the bending area BA. Accordingly, the thickness of the display device DD may be reduced in the bending area BA. The groove GV may extend in the second direction DR2.

Referring to FIG. 11, the bending area BA may be bent toward the lower portion of the display panel DP. The bending area BA may be bent so that the first area A1 is disposed below the second area A2. Accordingly, the data driver DDV may be disposed below the display panel DP.

Because the panel protective film PPF, the first adhesive layer AL1, the cushion layer CSL, and the fourth adhesive layer AL4 are not disposed in the bending area BA, the bending area BA may be more easily bent. By way of example, the folding area FA may overlap a central portion of the display area DA.

Figure 12:
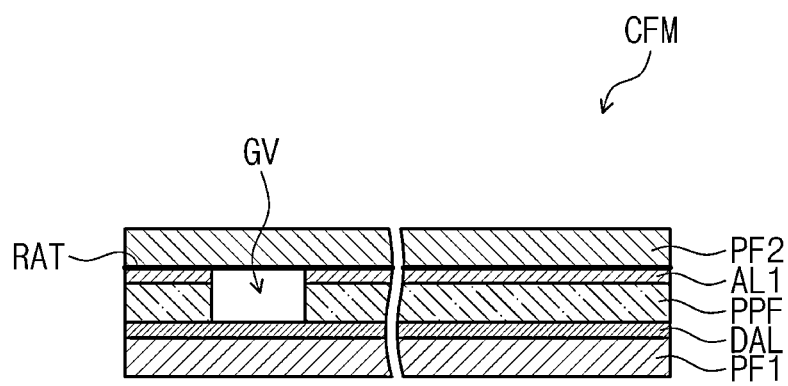
FIG. 12 illustrates an exemplary embodiment of a structure of a carrier film according to the invention.

FIG. 12 illustrates an exemplary embodiment of a structure of a carrier film according to the invention.

A cross section of the carrier film is exemplarily illustrated in FIG. 12.

Referring to FIG. 12, a carrier film CFM may include the panel protective film PPF used in manufacturing the display device DD. The panel protective film PPF may be protected by the carrier film CFM and transferred to a chamber to manufacture the display device DD.

The carrier film CFM may include a first protective film PF1, a second protective film PF2, the panel protective film PPF, the first adhesive layer AL1, a dummy adhesive layer DAL, and a releasing agent RAT. The second protective film PF2 may be disposed on the first protective film PF1.

The panel protective film PPF may be disposed between the first protective film PF1 and the second protective film PF2. The first adhesive layer AL1 may be disposed between the second protective film PF2 and the panel protective film PPF. The dummy adhesive layer DAL may be disposed between the panel protective film PPF and the first protective film PF1.

The first adhesive layer AL1 and the dummy adhesive layer DAL may include a pressure sensitive adhesive. The first adhesive layer AL1 and the dummy adhesive layer DAL may include an acrylic resin. In an exemplary embodiment, the first adhesive layer AL1 and the dummy adhesive layer DAL may include polyacrylate. The adhesive strength of the first adhesive layer AL1 may be greater than the adhesive strength of the dummy adhesive layer DAL, for example.

A groove GV may be defined in the panel protective film PPF and the first adhesive layer AL1. The groove GV may correspond to the groove GV illustrated in FIG. 10.

The releasing agent RAT may be disposed between the second protective film PF2 and the first adhesive layer AL1. A bottom surface of the second protective film PF2 facing the panel protective film PPF may be coated with the releasing agent RAT. Because the bottom surface of the second protective film PF2 is coated with the releasing agent RAT, the first adhesive layer AL1 may adhere to the panel protective film PPF more strongly than to the second protective film PF2.

The releasing agent RAT may include any one of a silicone releasing agent and a fluorine releasing agent. In an exemplary embodiment of the invention, for example, the releasing agent RAT may include a silicone releasing agent. The second protective film PF2 may be easily peeled off from the panel protective film PPF by the releasing agent RAT. In an exemplary embodiment, the second protective film PF2 may be easily separated from the first adhesive layer AL1 by the releasing agent RAT, for example.

A top surface of the first protective film PF1 facing the panel protective film PPF may be coated with the dummy adhesive layer DAL. When the top surface of the first protective film PF1 is coated with the dummy adhesive layer DAL, the dummy adhesive layer DAL may adhere to the first protective film PF1 more strongly than to the panel protective film PPF.

FIGS. 13 to 16 are views for describing a method of manufacturing a display device by the carrier film illustrated in FIG. 12.

FIGS. 13 to 16 illustrate, by way of example, cross sections corresponding to the cross section illustrated in FIG. 10.

Figure 13:
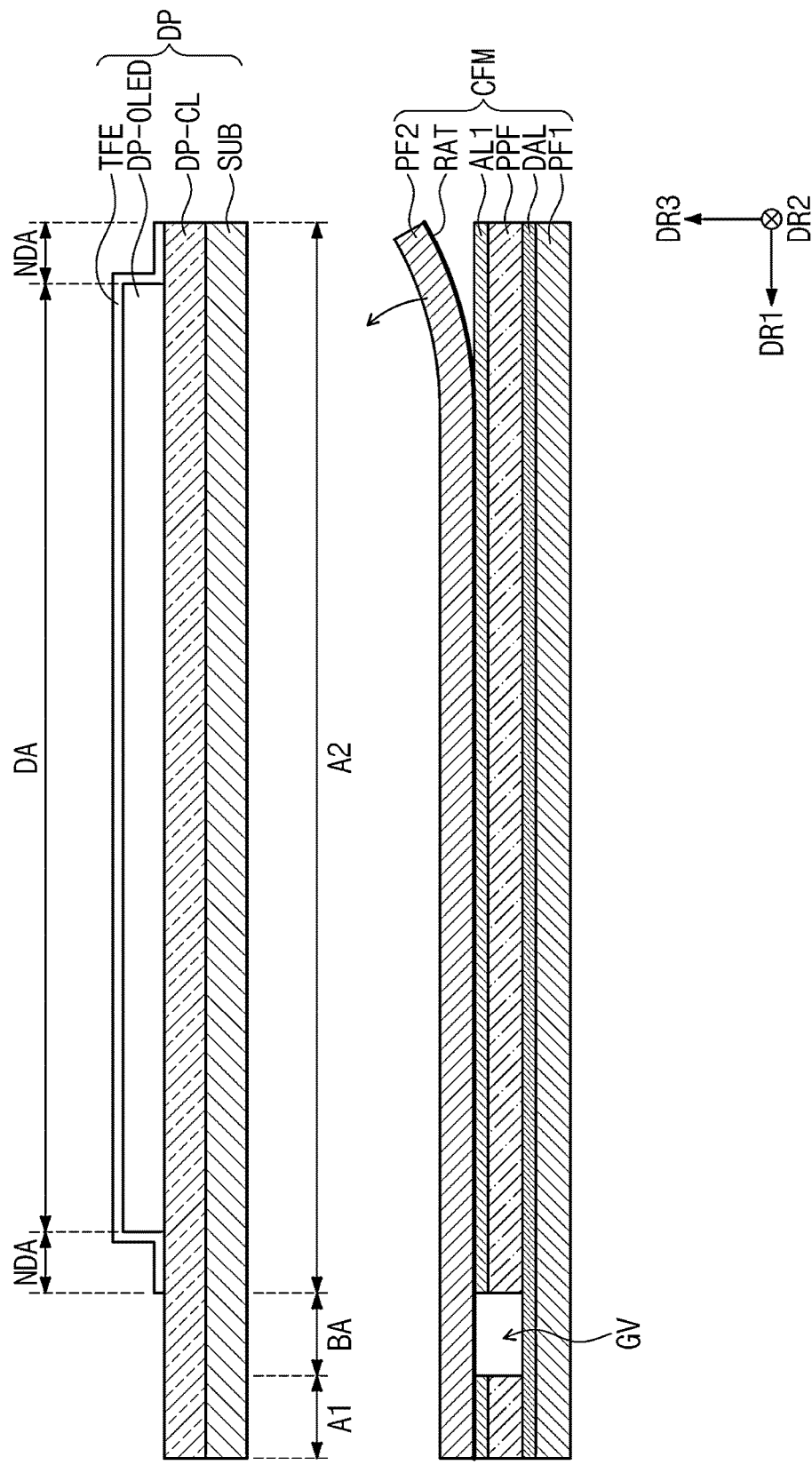
FIGS. 13 to 16 are views for describing a method of manufacturing a display device by the carrier film illustrated in FIG. 12.

Referring to FIG. 13, a carrier film CFM may be disposed below a display panel DP. A second protective film PF2 may be separated from the carrier film CFM. In an exemplary embodiment, the second protective film PF2 may be peeled off from a first adhesive layer AL1, for example. Because a releasing agent RAT is disposed on a bottom surface of the second protective film PF2, the second protective film PF2 may be easily peeled off from the first adhesive layer AL1.

Figure 14:
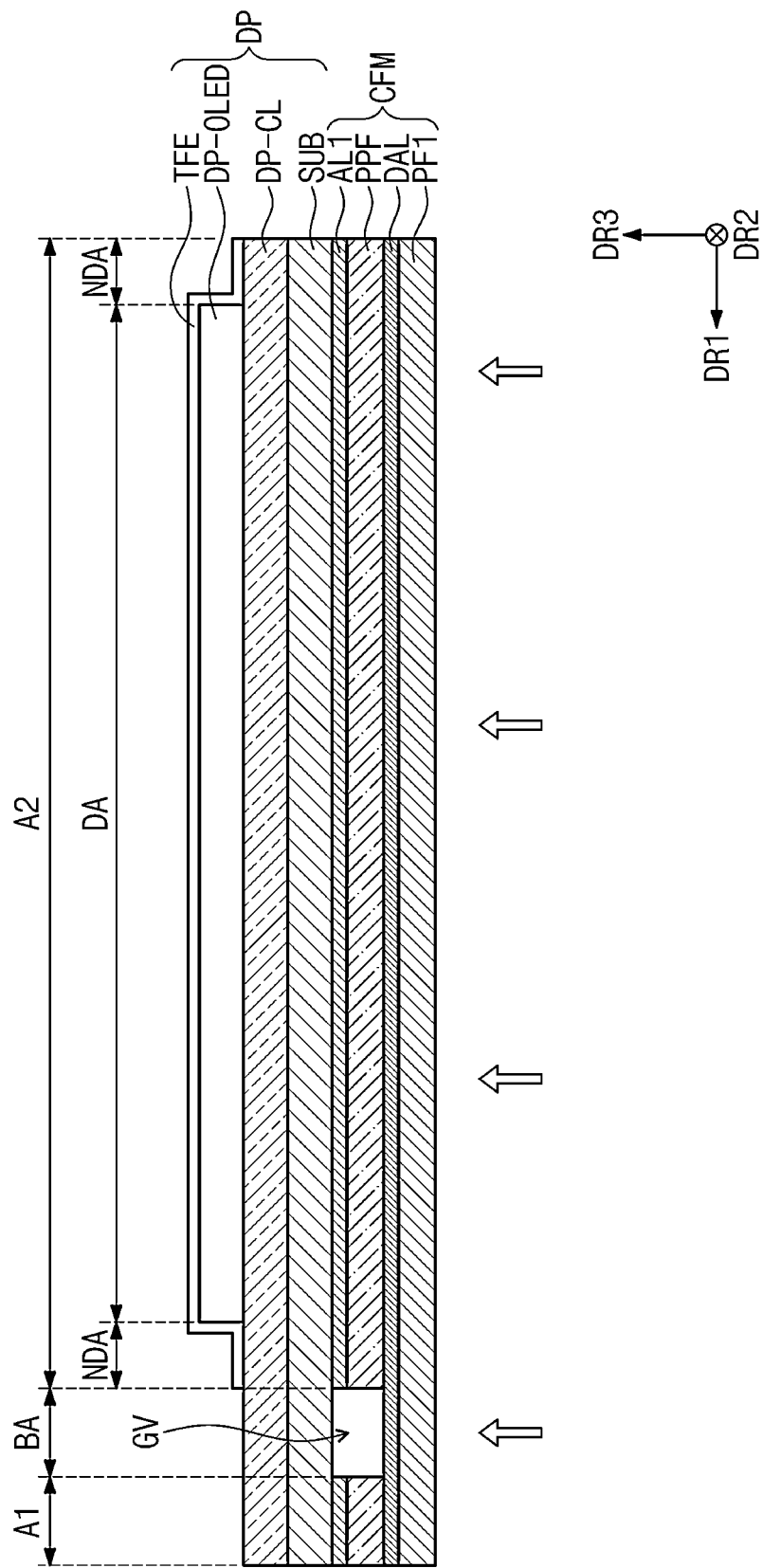

Referring to FIG. 14, the first adhesive layer AL1 may be attached to a lower portion of the display panel DP. In an exemplary embodiment, a panel protective film PPF may be attached to a lower portion of a substrate SUB by the first adhesive layer AL1, for example. A groove GV defined in the first adhesive layer AL1 and the panel protective film PPF may overlap a bending area BA.

In an exemplary embodiment, the panel protective film PPF may have a thickness of about 10 micrometers (μm) to about 50 μm in the third direction DR3, for example. In an exemplary embodiment, the first adhesive layer AL1 may have a thickness of about 5 μm to about 18 μm in the third direction DR3, for example. In an exemplary embodiment, a first protective film PF1 may have a thickness of about 30 μm to about 75 μm in the third direction DR3, for example. In an exemplary embodiment, a dummy adhesive layer DAL may have a thickness of about 1 μm to about 10 μm, for example.

Figure 15:
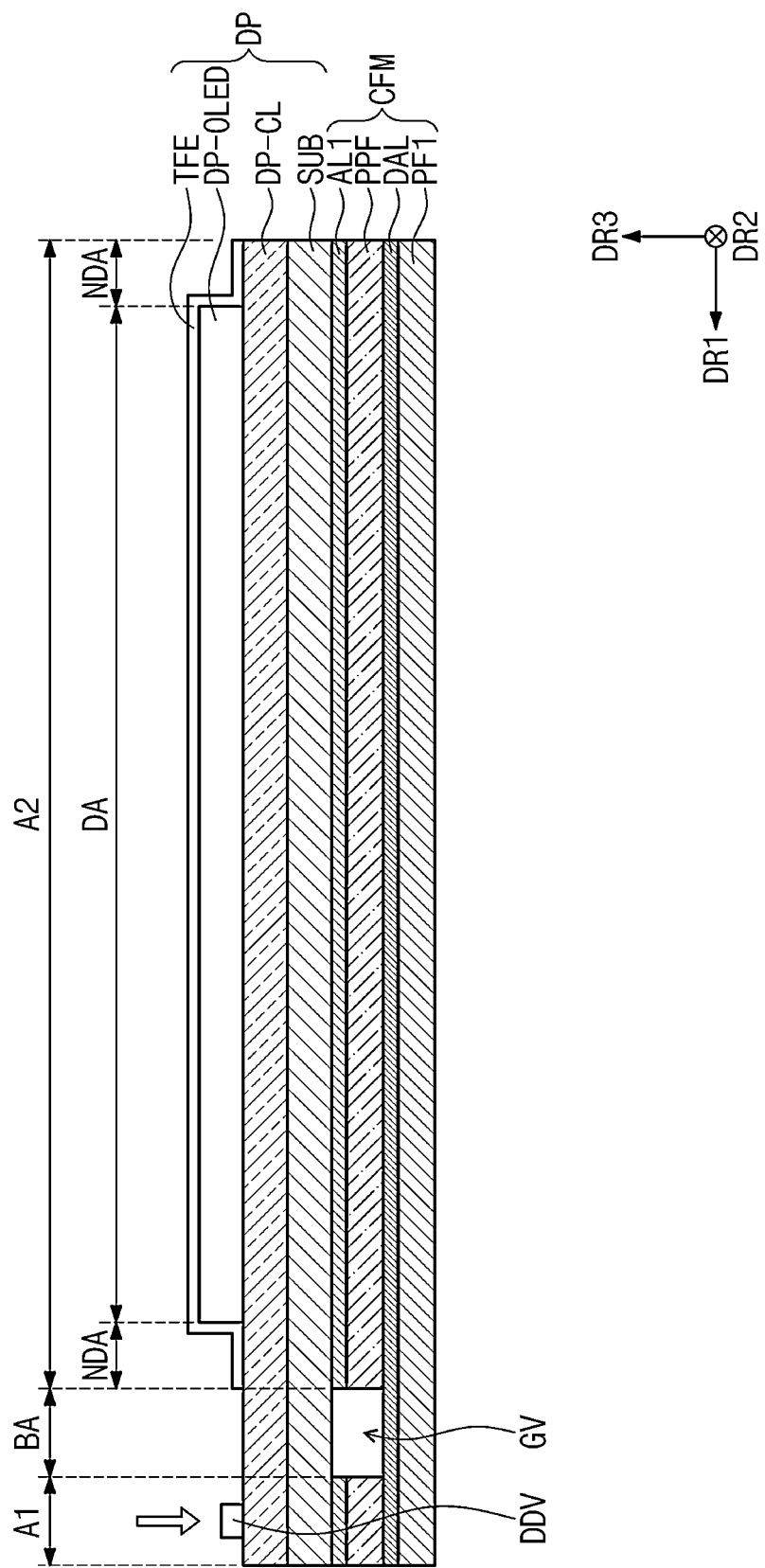

Referring to FIG. 15, a data driver DDV may be disposed on the display panel DP in a first area A1. The data driver DDV may be disposed (e.g., mounted) on the display panel DP in the first area A1 by a bonding process with a high temperature and a high pressure. The first area A1 may be defined as a bonding part.

When the data driver DDV is disposed (e.g., mounted) in the first area A1, a high temperature may be applied to the first area A1. In addition, a high pressure may be applied to the first area A1 through the data driver DDV. An adhesive layer and a film including a polymer resin may vary in elastic properties depending on temperature.

A portion of the carrier film CFM disposed below the display panel DP in the first area A1 may serve to support the display panel DP in the first area A1 during the bonding process. When the elastic properties of the carrier film CFM are low, the carrier film CFM may be plastically deformed by a high temperature and a high pressure applied to the first area A1. In this case, the carrier film CFM serving as a support is deformed, and thus wires disposed in the first area A1 may be damaged by the high pressure applied to the first area A1.

However, the carrier film CFM in an exemplary embodiment of the invention may maintain high elastic properties at a high temperature. Accordingly, the carrier film CFM may easily serve as the support in the first area A1, so that damage to the wires disposed in the first area A1 may be prevented even when a high pressure is applied to the first area A1. The physical properties of the carrier film CFM having high elastic properties will be described in detail with reference to the following tables.

Figure 16:
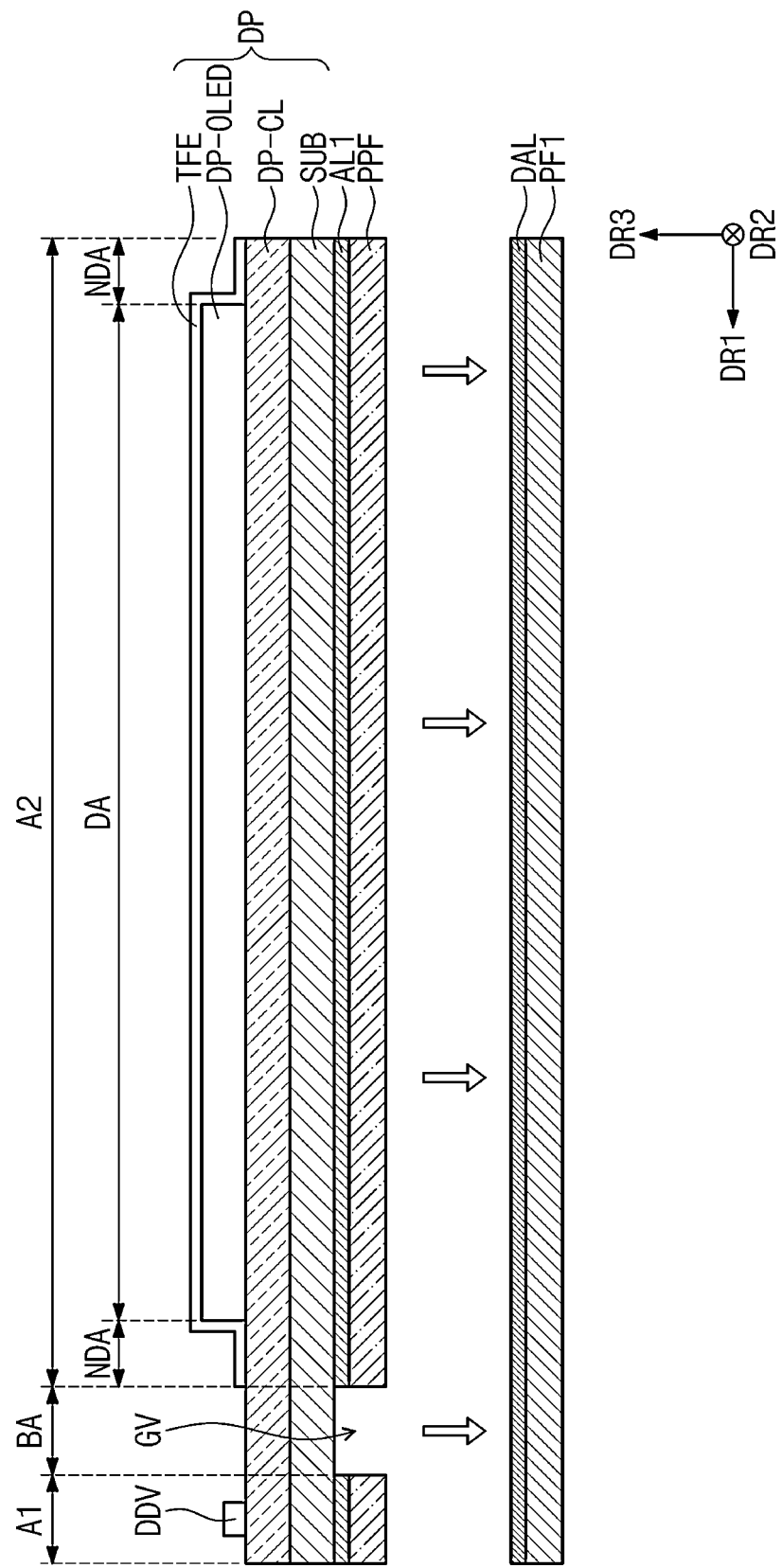

Referring to FIG. 16, the first protective film PF1 and the dummy adhesive layer DAL may be separated from the panel protective film PPF. Because the adhesive strength of the dummy adhesive layer DAL is smaller than that of the first adhesive layer AL1, the first protective film PF1 and the dummy adhesive layer DAL may be easily peeled off from the panel protective film PPF. Accordingly, the panel protective film PPF may maintain a state in which the panel protective film PPF is attached to the display panel DP by the first adhesive layer AL1.

In the case that the adhesive strength of the dummy adhesive layer DAL is greater than that of the first adhesive layer AL1, the panel protective film PPF may be peeled off from the display panel DP when the first protective film PF1 is peeled off. In an exemplary embodiment of the invention, however, the panel protective film PPF may not be peeled off from the display panel DP because the adhesive strength of the dummy adhesive layer DAL is smaller than the adhesive strength of the first adhesive layer AL1.

Thereafter, as illustrated in FIG. 10, a cushion layer CSL may be attached to a lower portion of the panel protective film PPF by a fourth adhesive layer AL4. Then, as illustrated in FIG. 11, the bending area BA may be bent and thus the first area A1 may be disposed below a second area A2.

Hereinafter, the physical properties of the panel protective film PPF, the first adhesive layer AL1, the first protective film PF1, and the dummy adhesive layer DAL in an exemplary embodiment of the invention will be described as Embodiment 1 with reference to the following tables having test results depending on various temperature conditions. In addition, the physical properties of a comparative panel protective film PPF', a first comparative protective film PF1', and a comparative dummy adhesive layer DAL' will be described as Embodiment 2 with reference to the following tables having test results depending on various temperature conditions.

The comparative panel protective film PPF', the first comparative protective film PF1', and the comparative dummy adhesive layer DAL', which are defined as Embodiment 2, may be substantially a typical panel protective film, a typical first protective film, and a typical dummy adhesive layer.

In the specification, Young's modulus and a yielding point of each of the panel protective film PPF and the comparative panel protective film PPF' correspond to values measured using a universal testing machine ("UTM"). Young's modulus is a coefficient indicating how an elastic object changes in length relative to stress, and may be defined as an elastic modulus.

The yielding point may be defined as stress when an object under the stress no longer retains elasticity and is deformed permanently. The yielding point may be defined as a value of the boundary between elastic deformation and plastic deformation.

A test specimen to measure Young's modulus and the yielding point has been prepared by cutting according to ISO 527-3 type 5 standard.

Figure 17:
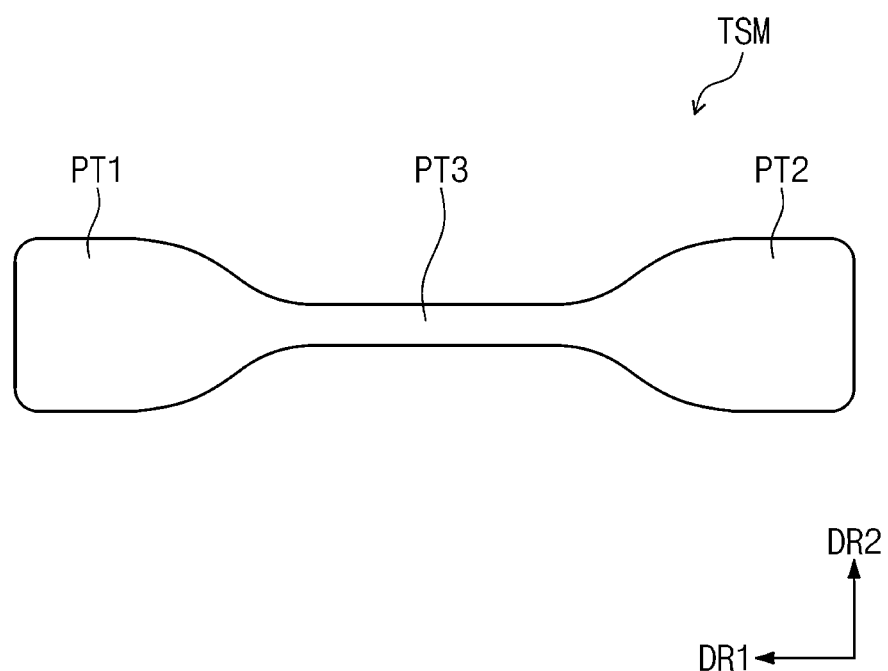
FIG. 17 is a plan view of a test specimen tested by a universal testing machine.

FIG. 17 is a plan view of the test specimen tested by the universal testing machine.

Referring to FIG. 17, a test specimen TSM has a shape cut according to ISO 527-3 type 5 standard. The test specimen TSM may extend in the first direction DR1. The test specimen TSM may include a first part PT1, a second part PT2, and a third part PT3 between the first part PT1 and the second part PT2. The first part PT1, the second part PT2, and the third part PT3 may be arranged in the first direction DR1. The width of each of the first part PT1 and the second part PT2 may be greater than the width of the third part PT3 with respect to the second direction DR2.

Jigs may hold the first part PT1 and the second part PT2 and move in the first direction DR1. Young's modulus and the yielding point of the test specimen TSM may be measured as the jigs move in opposite directions to pull the test specimen TSM.

A moving speed of the jigs may be set to about 5 millimeters per minute (mm/min), and Young's modulus and the yielding point of the test specimen TSM may be measured. The moving speed of the jigs may be defined as a test speed of a tensile test to measure Young's modulus and the yielding point. Young's modulus has been measured in a range of strain in which the strain of each of the panel protective film PPF and the comparative panel protective film PPF' is about 0.05% to about 0.5%.

Table 1 shows, in conditions of about 25° C. and about 85° C., test results of Young's modulus of the panel protective film PPF and test results of Young's modulus of the comparative panel protective film PPF'. A temperature of about 25° C. may be defined as room temperature, and a temperature of about 85° C. may be defined as a high temperature higher than room temperature.

TABLE 1

| Test Specimen | Measurement Number | Young' Modulus (Unit: MPa) | |
|---|---|---|---|
| | | 25° C. | 85° C. |
| Embodiment 1 (PPF) | 1 | 4627 | 3646 |
| | 2 | 4792 | 3718 |
| | 3 | 4324 | 3924 |
| Embodiment 2 (PPF') | 1 | 4202 | 3330 |
| | 2 | 4143 | — |
| | 3 | — | — |

Referring to the results of Table 1, the panel protective film PPF may have a Young's modulus of about 4324 MPa to about 4792 MPa at about 25° C. The panel protective film PPF may have a Young's modulus of about 3646 MPa to about 3924 MPa at about 85° C. At about 25° C. and about 85° C., the panel protective film PPF may have greater Young's moduli than the comparative panel protective film PPF'.

Table 2 shows, in conditions of about 25° C., about 85° C., and about 210° C., test results of the yielding point of the panel protective film PPF and test results of the yielding point of the comparative panel protective film PPF'. A temperature of about 25° C. may be defined as room temperature, and temperatures of about 85° C. and about 210° C. may be defined as high temperatures higher than room temperature.

TABLE 2

| Test Specimen | Measurement Number | Yielding Point (Stress: MPa) | | | Yielding Point (Strain: %) | | |
|---|---|---|---|---|---|---|---|
| | | 25° C. | 85° C. | 210° C. | 25° C. | 85° C. | 210° C. |
| Embodiment 1 (PPF) | 1 | 66.23 | 50.62 | 31.34 | 1.54 | 1.48 | 1.26 |
| | 2 | 68.13 | 51.58 | 30.44 | 1.53 | 1.49 | 1.19 |
| | 3 | 59.49 | 46.56 | 29.97 | 1.47 | 1.29 | 1.21 |
| Embodiment 2 (PPF') | 1 | 47.57 | 36.17 | 26.76 | 1.19 | 1.09 | 1.07 |
| | 2 | 47.27 | — | 26.12 | 1.20 | — | 1.07 |
| | 3 | — | — | 24.91 | — | — | 1.00 |

Referring to the results of Table 2, at about 25° C., the stress of the yielding point of the panel protective film PPF may be about 59.49 MPa to about 68.13 MPa, and the strain of the yielding point of the panel protective film PPF may be about 1.47% to about 1.54%.

At about 85° C., the stress of the yielding point of the panel protective film PPF may be about 46.56 MPa to about 51.58 MPa, and the strain of the yielding point of the panel protective film PPF may be about 1.29% to about 1.49%.

At about 210° C., the stress of the yielding point of the panel protective film PPF may be about 29.97 MPa to about 31.34 MPa, and the strain of the yielding point of the panel protective film PPF may be about 1.19% to about 1.26%. At about 25° C., about 85° C., and about 210° C., the panel protective film PPF may have greater yielding points than the comparative panel protective film PPF'.

At room temperature and a high temperature, the panel protective film PPF has greater Young's moduli and yielding points than the comparative panel protective film PPF', and thus may have higher elastic properties than the comparative panel protective film PPF'.

In the test results below, a storage modulus may indicate the degree of elasticity of a test specimen, and a loss modulus may indicate the degree of fluid properties of a test specimen.

In this specification, the storage modulus of each of the panel protective film PPF and the comparative panel protective film PPF' corresponds to a value measured using a dynamic mechanical analyzer ("DMA") of TA Instruments, Inc.

Test specimens to measure a storage modulus have been prepared by working each of a panel protective film PPF and a comparative panel protective film PPF' having a thickness of about 1 µm to about 100 µm into a test specimen having a size of about 6 mm×about 50 mm respectively in width and length.

Opposite ends of the test specimen in a length direction have been fixed by jigs, and preload force has been set to about 0.05 Newton (N) in the dynamic mechanical analyzer to flatten the test specimen. The preload force may be defined as force previously applied to a test specimen in the length direction by jigs to flatten the test specimen. The preload force is generally known in the use of a dynamic mechanical analyzer, and thus a detailed description is omitted.

The storage modulus has been measured in the dynamic mechanical analyzer under the condition that a vibration having an amplitude of about 10 µm and a frequency of about 1 Hertz (Hz) is applied to the test specimen in the length direction, a force track is set to about 125%, and a temperature increase rate is set to about 3 degrees Celsius per minute (° C./min).

In the case of a test specimen of a polymer film, deformation may occur in a specific temperature range when an analysis is performed while raising the temperature. In this case, when constant static force is applied, the polymer film is plastically deformed completely and further analysis may not proceed.

Accordingly, a force track value may be set to control the stress applied to the polymer film so that the analysis may proceed after the temperature becomes higher than a temperature at which deformation occurs. The force track is expressed as a percentage of static force to dynamic force, and is generally maintained at a value of about 100% or greater. In an exemplary embodiment of the invention, the force track is set to about 125%. The force track is generally known in the use of a dynamic mechanical analyzer, and thus a detailed description is omitted.

Table 3 shows, in conditions of about 25° C. and about 60° C., test results of the storage modulus of the panel protective film PPF and test results of the storage modulus of the comparative panel protective film PPF'. A temperature of about 25° C. may be defined as room temperature, and a temperature of about 60° C. may be defined as a high temperature higher than room temperature.

TABLE 3

| Test Specimen | Measurement Number | Storage Modulus (MPa) | |
|---|---|---|---|
| | | 25° C. | 60° C. |
| Embodiment 1 (PPF) | 1 | 2419 | 2218 |
| | 2 | 2414 | 2237 |
| | 3 | 2391 | 2181 |
| Embodiment 2 (PPF') | 1 | 2312 | 2156 |
| | 2 | 2249 | 2149 |
| | 3 | 2251 | 2116 |

Referring to the results of Table 3, the panel protective film PPF may have a storage modulus of about 2391 MPa to about 2419 MPa at about 25° C. The panel protective film PPF may have a storage modulus of about 2181 MPa to about 2237 MPa at about 60° C. At about 25° C. and about 60° C., the panel protective film PPF may have a higher storage modulus than the comparative panel protective film PPF'. Accordingly, at room temperature and a high temperature, the panel protective film PPF may have higher elastic properties than the comparative panel protective film PPF'.

In this specification, a storage modulus and a loss modulus of the first adhesive layer AL1 correspond to values measured using a rheometer of TA Instruments, Inc. A test specimen to measure the storage modulus and the loss modulus has been prepared by working the first adhesive layer AL1 into a test specimen of a circular shape having a diameter of about 8 mm and a thickness of about 800 µm.

The storage modulus and the loss modulus have been measured, at a temperature increase rate of about 3° C./min, under the condition that the rheometer applies a frequency of about 1 Hz and an axial force of about 1.0 N to the test specimen and the strain of the test specimen is maintained at about 1%.

Table 4 shows test results of the storage modulus, the loss modulus, and tan delta value of the first adhesive layer AL1 at about 25° C., about 70° C., and about 210° C. A temperature of about 25° C. may be defined as room temperature, and temperatures of about 70° C. and about 210° C. may be defined as high temperatures higher than room temperature. The tan delta value may be defined as the value of the loss modulus/the storage modulus. That is, the tan delta value may be a value obtained by dividing the loss modulus by the storage modulus.

TABLE 4

| Test Specimen | Measurement Number | Storage Modulus (MPa) | | | Loss Modulus (MPa) | | | Tan Delta value | | |
| --- | --- | --- | --- | --- | --- | --- | --- | --- | --- | --- |
| | | 25° C. | 70° C. | 210° C. | 25° C. | 70° C. | 210° C. | 25° C. | 70° C. | 210° C. |
| Embodiment 1 (AL1) | 1 | 0.0612 | 0.0270 | 0.0194 | 0.0232 | 0.0112 | 0.0043 | 0.3796 | 0.4141 | 0.2198 |
| | 2 | 0.0560 | 0.0253 | 0.0179 | 0.0210 | 0.0101 | 0.0038 | 0.3741 | 0.3970 | 0.2135 |
| | 3 | 0.0594 | 0.0297 | 0.0196 | 0.0225 | 0.0123 | 0.0044 | 0.3788 | 0.4151 | 0.2238 |

Referring to the results of Table 4, the first adhesive layer AL1 may have, at about 25° C., a storage modulus of about 0.0560 MPa to about 0.0612 MPa, a loss modulus of about 0.0210 MPa to about 0.0232 MPa, and a tan delta value of about 0.3741 to about 0.3796.

The first adhesive layer AL1 may have, at about 70° C., a storage modulus of about 0.0253 MPa to about 0.0297 MPa, a loss modulus of about 0.0101 MPa to about 0.0123 MPa, and a tan delta value of about 0.3970 to about 0.4151.

The first adhesive layer AL1 may have, at about 210° C., a storage modulus of about 0.0179 MPa to about 0.0196 MPa, a loss modulus of about 0.0038 MPa to about 0.0044 MPa, and a tan delta value of about 0.2135 to about 0.2238.

In this specification, a storage modulus and a loss modulus of each of the first protective film PF1 and the first comparative protective film PF1' correspond to values measured using a DMA.

Test specimens to measure the storage modulus and the loss modulus have been prepared by working each of a first protective film PF1 and a first comparative protective film PF1' having a thickness of about 1 μm to about 100 μm into a test specimen having a size of about 6 mm×about 50 mm respectively in width and length.

Preload force has been set to about 0.05 N. The storage modulus and the loss modulus has been measured, in the dynamic mechanical analyzer, under the condition that a vibration having an amplitude of about 10 μm and a frequency of about 1 Hz is applied to the test specimen in a length direction, a force track is set to about 125%, and a temperature increase rate is set to about 3° C./min.

Table 5 shows, in a condition of about 70° C., test results of the storage modulus, the loss modulus, and a tan delta value for each of the first protective film PF1 and the first comparative protective film PF1'. A temperature of about 70° C. may be defined as a high temperature higher than room temperature.

TABLE 5

| Test Specimen | Measurement Number | Storage Modulus (MPa) 70° C. | Loss Modulus (MPa) 70° C. | Tan Delta value 70° C. |
| --- | --- | --- | --- | --- |
| Embodiment 1 (PF1) | 1 | 2463 | 100 | 0.0409 |
| | 2 | 2451 | 110 | 0.0457 |
| | 3 | 2611 | 99 | 0.0378 |
| Embodiment 2 (PF1') | 1 | 2362 | 157 | 0.0674 |
| | 2 | 2348 | 152 | 0.0657 |
| | 3 | 2318 | 154 | 0.0669 |

Referring to the results of Table 5, the first protective film PF1 may have, at about 70° C., a storage modulus of about 2451 MPa to about 2611 MPa, a loss modulus of about 99 MPa to about 110 MPa, and a tan delta value of about 0.0378 to about 0.0457. At about 70° C., the first protective film PF1 may have a smaller tan delta value than the first comparative protective film PF1'.

As the temperature increases, elastic properties of a polymer resin may be lowered. As the storage modulus becomes greater than the loss modulus, the elastic properties may be better maintained. Accordingly, the smaller the tan delta value defined as the value of the loss modulus divided by the storage modulus, the better the elastic properties.

Because, at about 70° C., the first protective film PF1 has a smaller tan delta value than the first comparative protective film PF1', the first protective film PF1 may have larger elastic properties at a high temperature than the first comparative protective film PF1' at the high temperature.

In this specification, a storage modulus and a loss modulus of each of the dummy adhesive layer DAL and the comparative dummy adhesive layer DAL' correspond to values measured using a DMA. Test specimens to measure the storage modulus and the loss modulus have been prepared by working each of the dummy adhesive layer DAL and the comparative dummy adhesive layer DAL' into a test specimen having a thickness of about 800 μm, a width of about 10 mm, and a length of about 10 mm.

Two test specimens may be prepared per each of the tests for the dummy adhesive layer DAL and the comparative dummy adhesive layer DAL'. The dummy adhesive layer DAL may have a much lower adhesive strength than the first adhesive layer AL1. In general, when the adhesive strength is very low, a storage modulus and/or a loss modulus of an adhesive layer are measured using a shear sandwich mode of the dynamic mechanical analyzer. Accordingly, the two test specimens may be prepared, to use the shear sandwich mode, for each of the dummy adhesive layer DAL and the comparative dummy adhesive layer DAL'.

In the shear sandwich mode, the two test specimens may be disposed (e.g., mounted) to two clamps of the dynamic mechanical analyzer. A support is placed between the two test specimens, one of the test specimens is placed between one of the clamps and the support, the other of the test specimens is placed between the other of the clamps and the support, and thus the test specimens may be fixed by the clamps, for example. After the test specimens are fixed by the clamps, the test may be carried out.

The storage modulus and the loss modulus have been measured, at a temperature increase rate of about 3° C./min, under the condition that the dynamic mechanical analyzer applies a frequency of about 1 Hz and an axial force of about 1.0 N to the test specimens and the strain of the test specimens is maintained at about 1%.

Table 6 shows, in conditions of about 25° C. and about 70° C., test results of the storage modulus, the loss modulus, and tan delta value of the dummy adhesive layer DAL, and test results of the storage modulus, the loss modulus, and tan delta value of the comparative dummy adhesive layer DAL'. A temperature of about 70° C. may be defined as a high temperature higher than room temperature.

TABLE 6

| Test Specimen | Measurement Number | Storage Modulus (MPa) 25° C. | Storage Modulus (MPa) 70° C. | Loss Modulus (MPa) 25° C. | Loss Modulus (MPa) 70° C. | Tan Delta value 25° C. | Tan Delta value 70° C. |
|---|---|---|---|---|---|---|---|
| Embodiment 1 (DAL) | 1 | 292 | 310 | 3.5 | 3.5 | 0.012 | 0.011 |
| | 2 | 310 | 334 | 5.9 | 3.2 | 0.019 | 0.010 |
| | 3 | 306 | 323 | 6.5 | 2.9 | 0.021 | 0.009 |
| Embodiment 2 (DAL') | 1 | 490 | 513 | 11.3 | 23 | 0.023 | 0.046 |
| | 2 | 480 | 513 | 11.8 | 23 | 0.025 | 0.045 |
| | 3 | 465 | 486 | 12.2 | 19 | 0.026 | 0.040 |

Referring to the results of Table 6, the dummy adhesive layer DAL may have, at about 25° C., a storage modulus of about 292 MPa to about 310 MPa, a loss modulus of about 3.5 MPa to about 6.5 MPa, and a tan delta value of about 0.012 to about 0.021. The dummy adhesive layer DAL may have, at about 70° C., a storage modulus of about 310 MPa to about 334 MPa, a loss modulus of about 2.9 MPa to about 3.5 MPa, and a tan delta value of about 0.009 to about 0.011.

As described above, the smaller the tan delta value defined as the value of the loss modulus divided by the storage modulus, the better the elastic properties. Because, at about 25° C. and about 70° C., the dummy adhesive layer DAL has smaller tan delta values than the comparative dummy adhesive layer DAL', the dummy adhesive layer DAL may have greater elastic properties at room temperature and a high temperature than the comparative dummy adhesive layer DAL' at room temperature and the high temperature.

According to the above-described test results, the carrier film CFM may have high elastic properties because the panel protective film PPF, the first protective film PF1, and the dummy adhesive layer DAL have high elastic properties.

Because the panel protective film PPF has high elastic properties, the deformation in the folding area FA may be reduced when the display device DD is repeatedly folded. In addition, because the carrier film CFM has high elastic properties, damage to the wires of the bonding part may be reduced during a bonding process.

As a result, the display device DD and the carrier film CFM in an exemplary embodiment of the invention may reduce the deformation in the folding area and the damage to the wires of the bonding part during a folding operation and a bonding process.

The display device in an exemplary embodiment of the invention includes the panel protective film and the first adhesive layer having high elastic properties, so that deformation in the folding area may be reduced during a folding operation. In addition, because the carrier film disposed below the bonding part of the display device has high elastic properties, the damage to the wires of the bonding part may be reduced during the bonding process of the data driver.

Although the exemplary embodiments of the invention have been described herein, it is understood that various changes and modifications may be made by those skilled in the art within the spirit and scope of the invention defined by the following claims or the equivalents. The exemplary embodiments described herein are not intended to limit the technical spirit and scope of the invention, and all technical spirit within the scope of the following claims or the equivalents will be construed as being included in the scope of the invention.

What is claimed is:

1. A display device comprising:
a display panel;
a panel protective film disposed below the display panel; and
a first adhesive layer disposed between the display panel and the panel protective film,
wherein under a setting in which a test speed of a tensile test of the panel protective film is 5 millimeters per minute, and Young's modulus of the panel protective film is measured in a range of strain in which strain of the panel protective film is 0.05 percent to 0.5 percent, the panel protective film has the Young's modulus of 4324 megapascals to 4792 megapascals at 25 degrees Celsius, and has the Young's modulus of 3646 megapascals to 3924 megapascals at 85 degrees Celsius so that a deformation in a folding area of the display device is reduced,
wherein, at 210 degrees Celsius, stress of a yielding point of the panel protective film is 29.97 megapascals to 31.34 megapascals, and strain of the yielding point of the panel protective film is 1.19 percent to 1.26 percent.

2. The display device of claim 1, wherein, at 25 degrees Celsius, the stress of the yielding point of the panel protective film is 59.49 megapascals to 68.13 megapascals, and the strain of the yielding point of the panel protective film is 1.47 percent to 1.54 percent.

3. The display device of claim 1, wherein, at 85 degrees Celsius, the stress of the yielding point of the panel protective film is 46.56 megapascals to 51.58 megapascals, and the strain of the yielding point of the panel protective film is 1.29 percent to 1.49 percent.

4. The display device of claim 1, wherein the panel protective film has a storage modulus of 2391 megapascals to 2419 megapascals at 25 degrees Celsius when a vibration having an amplitude of 10 micrometers and a frequency of 1 Hertz is applied to the panel protective film and a force track is set to 125 percent.

5. The display device of claim 4, wherein the panel protective film has the storage modulus of 2181 megapascals to 2237 megapascals at 60 degrees Celsius.

6. The display device of claim 1, wherein the first adhesive layer has, at 25 degrees Celsius, a storage modulus of 0.0560 megapascals to 0.0612 megapascals, a loss modulus of 0.0210 megapascals to 0.0232 megapascals, and a tan delta value of 0.3741 to 0.3796 when a frequency of 1 Hertz and an axial force of 1.0 Newton are applied to the first adhesive layer and strain of the first adhesive layer is maintained at 1 percent.

7. The display device of claim 6, wherein the first adhesive layer has, at 70 degrees Celsius, the storage modulus of 0.0253 megapascals to 0.0297 megapascals, the loss modulus of 0.0101 megapascals to 0.0123 megapascals, and the tan delta value of 0.3970 to 0.4151.

8. The display device of claim 6, wherein the first adhesive layer has, at 210 degrees Celsius, the storage modulus of 0.0179 megapascals to 0.0196 megapascals, the loss modulus of 0.0038 megapascals to 0.0044 megapascals, and the tan delta value of 0.2135 to 0.2238.

9. The display device of claim 1, wherein the panel protective film comprises at least one of polyimide, polyamide, aramid, polyethylene naphthalene, and polyethylene terephthalate.

10. The display device of claim 1, wherein the first adhesive layer comprises an acrylic resin.

11. The display device of claim 1, wherein the panel protective film has a thickness of 10 micrometers to 50 micrometers, and the first adhesive layer has a thickness of 5 micrometers to 18 micrometers.

* * * * *